US012432855B2

(12) United States Patent
Guzar et al.

(10) Patent No.: US 12,432,855 B2
(45) Date of Patent: Sep. 30, 2025

(54) MULTIPLE CIRCUIT BOARD ASSEMBLY INCLUDING A SUPPORT ELEMENT AND METHOD OF MANUFACTURE THEREOF

(71) Applicant: WESTERN DIGITAL TECHNOLOGIES, INC., San Jose, CA (US)

(72) Inventors: Arjun Jayaprakash Guzar, Bangalore (IN); Joe Paul Moolanmoozha, Bangalore (IN); Shailesh R. Nayak, Bangalore (IN)

(73) Assignee: Sandisk Technologies, Inc., Milpitas, CA (US)

( * ) Notice: Subject to any disclaimer, the term of this patent is extended or adjusted under 35 U.S.C. 154(b) by 182 days.

(21) Appl. No.: 18/359,592

(22) Filed: Jul. 26, 2023

(65) Prior Publication Data

US 2024/0302876 A1    Sep. 12, 2024

Related U.S. Application Data

(60) Provisional application No. 63/488,812, filed on Mar. 7, 2023.

(51) Int. Cl.
*H05K 1/14*    (2006.01)
(52) U.S. Cl.
CPC ............. *H05K 1/144* (2013.01); *H05K 1/141* (2013.01)
(58) Field of Classification Search
CPC ... H05K 1/144; H05K 1/141; H05K 2201/042
See application file for complete search history.

(56) References Cited

U.S. PATENT DOCUMENTS

| 5,018,982 | A | 5/1991 | Speraw et al. |
|---|---|---|---|
| 5,575,686 | A | 11/1996 | Noschese |
| 5,793,998 | A | 8/1998 | Copeland et al. |
| 6,201,709 | B1 | 3/2001 | Justiniano et al. |
| 6,317,330 | B1 | 11/2001 | Portman et al. |
| 6,726,505 | B2 | 4/2004 | Cermak, III et al. |
| 10,965,059 | B2 * | 3/2021 | Tagashira ............... B25J 9/0009 |
| 11,172,574 | B2 * | 11/2021 | Shin ....................... H05K 3/361 |
| 2008/0019111 | A1 | 1/2008 | Zeng et al. |
| 2011/0199748 | A1 * | 8/2011 | Kagawa ............. H05K 7/20436 |
| | | | 361/796 |
| 2024/0088588 | A1 * | 3/2024 | Fujimura ............. H05K 1/0269 |

FOREIGN PATENT DOCUMENTS

JP    2001-111262 A    4/2001

OTHER PUBLICATIONS https://www.cisco.com/c/en/us/products/collateral/application-networking-services/wide-area-application-services-waas-software/data-sheet-c78-729778.html (Viewed on Jul. 26, 2023).
(Continued)

*Primary Examiner* — James Wu
(74) *Attorney, Agent, or Firm* — THE MARBURY LAW GROUP PLLC

(57) ABSTRACT

Systems and methods are described for assembling multiple circuit boards using support elements to provide a stacked circuit board assembly. A support element is mounted to a first (e.g., main) circuit board, and a pair of additional circuit boards (e.g., daughter boards) are mounted to the support element on two opposite sides of the first circuit board to provide a stacked circuit board assembly.

11 Claims, 17 Drawing Sheets

(56) References Cited

OTHER PUBLICATIONS https://www.cisco.com/c/en/us/td/docs/optical/ncs1010/hardware/guide/b-ncs1010-hardware-guide/m-overview.pdf (Viewed on Jul. 26, 2023).
https://www.cisco.com/c/en/us/products/collateral/optical-networking/network-convergence-system-4000-series/datasheet-c78-736495.html (Viewed on Jul. 26, 2023).
https://blogs.cisco.com/datacenter/the-power-of-possibilities-cisco-ucs-x210c-m6-compute-node (Viewed on Jul. 26, 2023).
https://www.touchpoint.com.au/shop/cisco-200g-cpak-mr-line-card-c-band-licensed-ncs2k-200g-ck-lic/ (Viewed on Jul. 26, 2023).

* cited by examiner

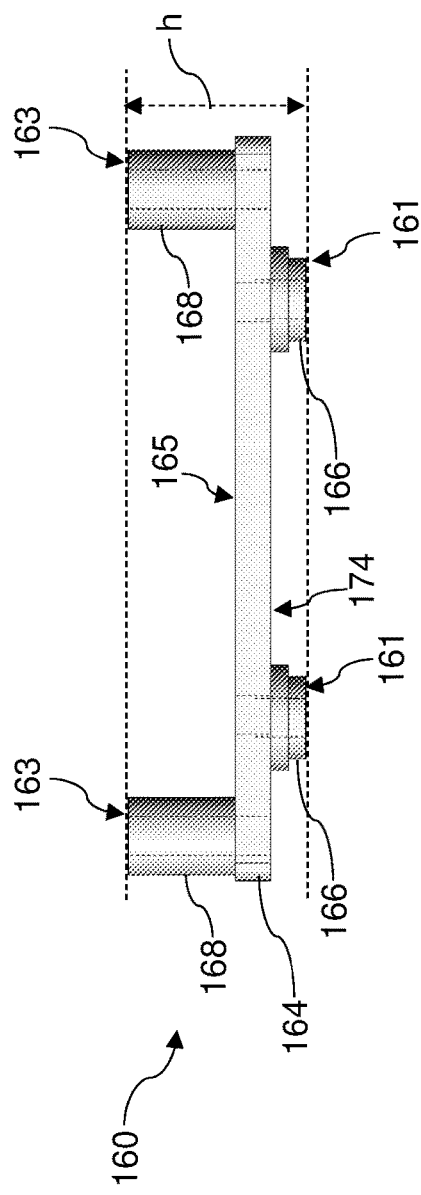
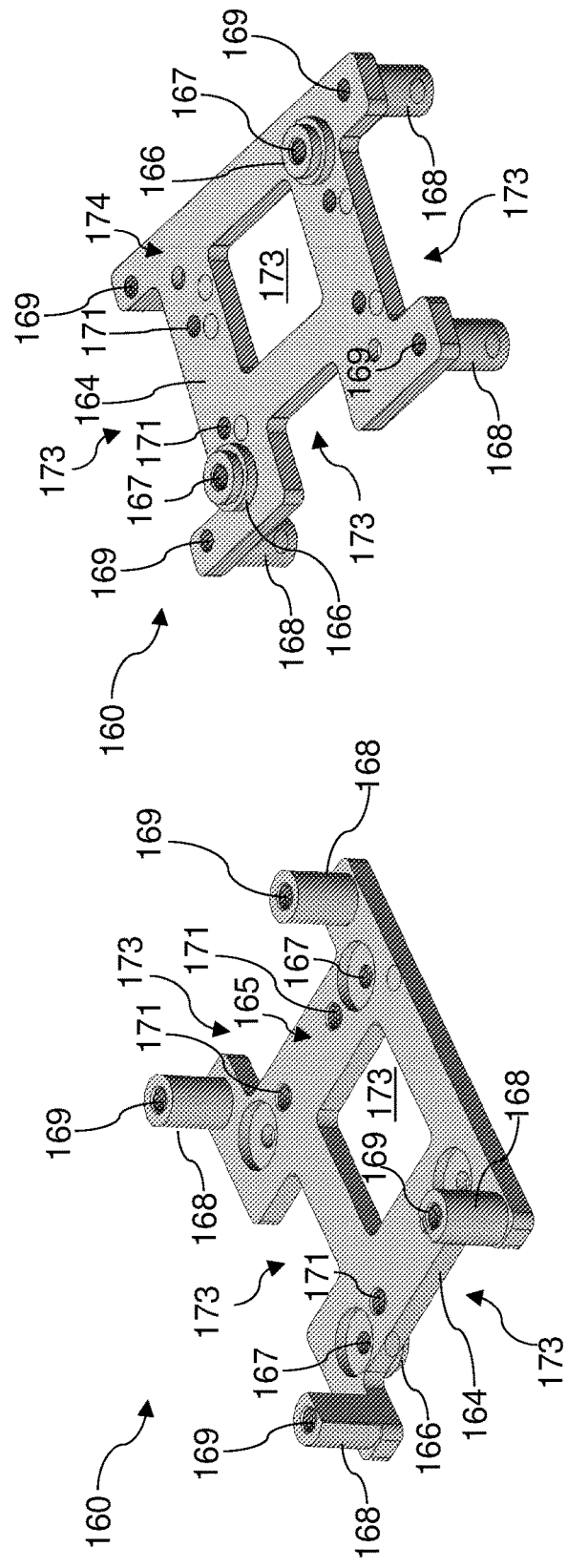

MULTIPLE CIRCUIT BOARD ASSEMBLY INCLUDING A SUPPORT ELEMENT AND METHOD OF MANUFACTURE THEREOF

FIELD

The present disclosure relates generally to the field of electronic systems, and particularly to multiple circuit board assemblies including support elements and methods of manufacture thereof.

BACKGROUND

Circuit boards, such as printed circuit boards (PCBs), are a component of many electronic systems and devices, including computer systems, data storage systems, network and telecommunications equipment, consumer electronics, industrial and medical equipment, automotive systems, aerospace and military equipment, testing and inspection equipment, and so forth.

SUMMARY

According to an aspect of the present disclosure, an electronic assembly includes a first circuit board, a support element including a central member mounted to a first surface of the first circuit board, a first board fixing feature extending from a first surface of the central member, and a second board fixing feature extending from a second surface of the central member that is opposite the first surface, where a first end of the support element is defined by an outer surface of the first board fixing feature, and a second end of the support element opposite the first end is defined by an outer surface of the second board fixing feature, a second circuit board contacting the first end of the support element and mounted to the first board fixing feature, a third circuit board contacting the second end of the support element and mounted to the second board fixing feature, a first inter-board connector extending between the first circuit board and the second circuit board, and a second inter-board connector extending between the second circuit board and the third circuit board.

According to another aspect of the present disclosure, a method of manufacturing an electronic assembly includes attaching a support element to a first circuit board such that a central member of the support element contacts a first surface of the first circuit board, a first board fixing feature extends from a first surface of the central member and defines a first end of the support element, and a second board fixing feature extends from a second surface of the central member and defines a second end of the support element, mounting a second circuit board over the first surface of the first circuit board such that a surface of the second circuit board contacts the first end of the support element and a first inter-board connector extends between the first surface of the first circuit board and the surface of the second circuit board, mounting a third circuit board over a second surface of the first circuit board that is opposite the first surface of the first circuit board such that a surface of the third circuit board contacts the second end of the support element and a second inter-board connector extends between the surface of the second circuit board and the surface of the third circuit board.

According to another aspect of the present disclosure, a support element for a multiple circuit board assembly includes a central member having a planar upper surface, a first board fixing feature extending from a lower surface of the central member and including an opening in a lower surface of the first board fixing feature, and a second board fixing feature extending from an upper surface of the central member and including an opening in an upper surface of the second board fixing feature.

BRIEF DESCRIPTION OF THE DRAWINGS

FIG. 4A is a side elevation view of a support element for a multi-board assembly according to various embodiments of the present disclosure.

FIG. 4B is a top perspective view of the support element of FIG. 4A.

FIG. 4C is a bottom perspective view of the support element of FIG. 4A.

DETAILED DESCRIPTION

Figure 1:
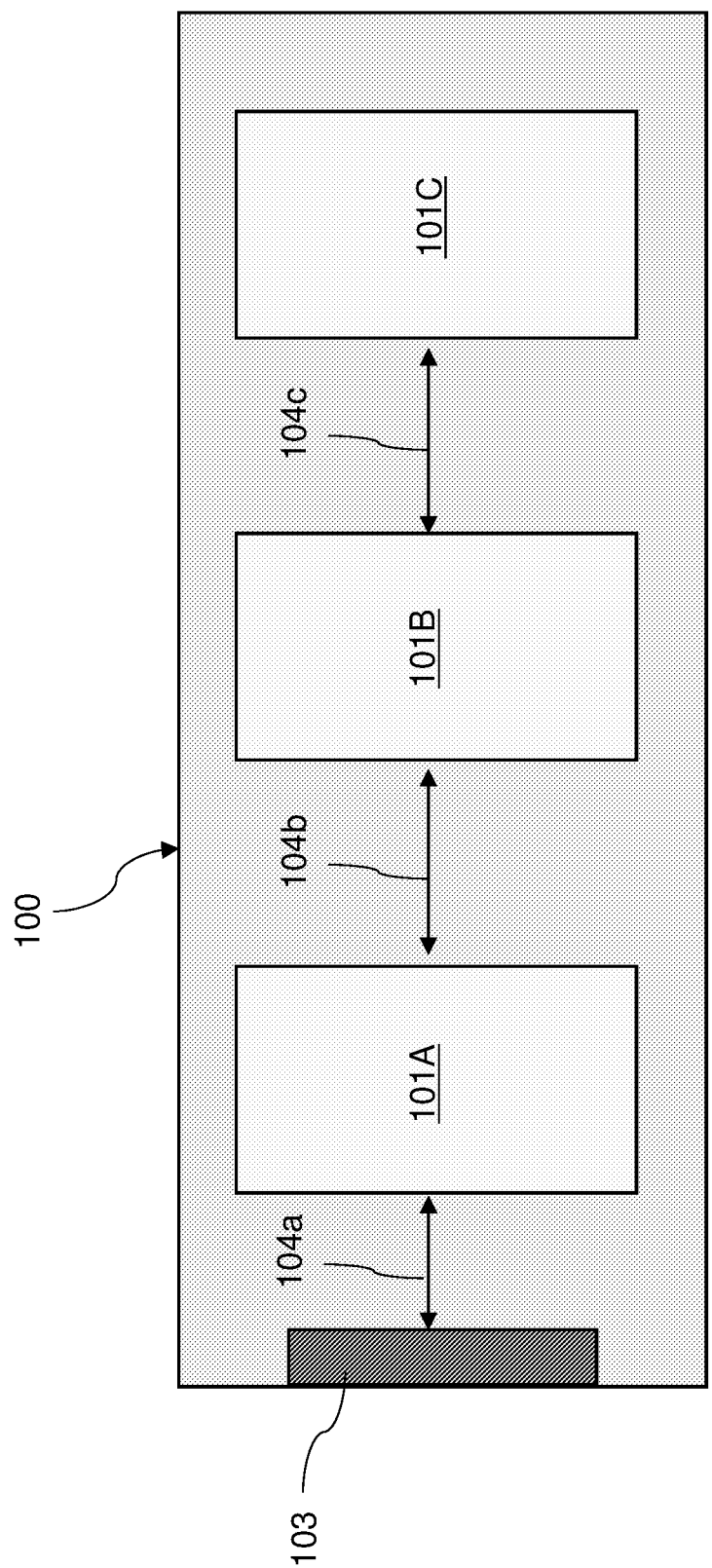
FIG. 1 schematically illustrates a circuit board according to various embodiments of the present disclosure.

As discussed above, the embodiments of the present disclosure are directed to the field of electronic systems, and particularly to assemblies including multiple circuit boards and support elements therefor. In various embodiments, a support element may be mounted to a first (e.g., main) circuit board, and a pair of additional circuit boards (e.g., daughter boards) may be mounted to the support element on two opposite sides of the first circuit board to provide a stacked circuit board assembly. The support element may provide a low mechanical tolerance for the assembly, which may provide a high-speed connector having a low wipe length to provide a direct electrical connection between the daughter boards, thereby providing improved signal flow within the stacked circuit board assembly.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

FIG. 1 schematically illustrates a circuit board 100, such as printed circuit board (PCB), according to various embodiments of the present disclosure. The circuit board 100 may be a component of an electronic device, such as a computer system, a network device, a server, etc. The circuit board 100 may include a substrate having various electronic components mounted thereto. The circuit board 100 may include a plurality of electrically conductive elements (e.g., bonding pads, conductive traces, etc.) that may be used to provide electrical connections to and between the various electronic components mounted to the circuit board 100. In one non-limiting example, the circuit board 100 may include a laminated structure including a solid substrate core made of a suitable structural material (e.g., a composite material, such as fiberglass) that is laminated with layers of conductive and insulating material over one or both sides of the substrate core. The conductive material of the laminated structure may include one or more sheet layers of a metal material (e.g., copper foil) that may be patterned (e.g., via photolithography and etching processes) to form conductive elements (i.e., bonding pads, conductive traces, etc.) of the circuit board 100. Each layer of conductive material may be laminated onto and/or between layers of an insulating substrate material, which may be an organic insulating material, such as a cured resin-impregnated fiber, cloth or paper material. A circuit board 100 may be single-sided (i.e., including conductive elements over one major surface of the substrate core) or double-sided (including conductive elements on two opposite major surfaces of the substrate core). In some embodiments, the circuit board 100 may be a multi-layer circuit board 100 including multiple layers of conductive material alternating with insulating substrate layers on one or both sides of the substrate core. In some embodiments, the circuit board 100 may include conductive via structures (e.g., plated through-holes) that connect multiple conductive layers located over one or both major surfaces of the substrate core. An optional protective layer (e.g., a solder mask) may be located over one or both major surfaces of the circuit board 100. It will be understood that other types of circuit boards 100 are within the contemplated scope of disclosure.

A plurality of electronic components may be mounted over one or both major surfaces of the circuit board 100. The electronic components may include, for example, one or more integrated circuits (ICs), such as a microprocessor, a central processing unit (CPU), a graphics processing unit (GPU), an application specific integrated circuit (ASIC), a field programmable gate array (FPGA), a digital signal processor (DSP), a memory chip, and the like, passive electronic components such as resistors, capacitors and/or inductors, diodes, transistors, optoelectronic components, wireless communication components, sensors, switches, power management components, and so forth. Other suitable electronic components are within the scope of disclosure. The electronic components may be electrically and mechanically coupled to underlying conductive elements of the circuit board 100, such as via solder connections. The circuit board 100 may include additional components, such as thermal management components (e.g., heat sinks, fans, etc.), mechanical elements for mounting the circuit board 100 to a support structure, and an input/output unit 103 (e.g., one or more connectors, as described in further detail below) for electrically coupling the circuit board 100 to external components and/or devices.

In some embodiments, the electronic components mounted to the circuit board 100 may form one or more functional units 101A, 101B and 101C. Each functional unit may include at least one integrated circuit (IC) and may be configured to perform a specific task or group of tasks (e.g., data processing operations, data storage and retrieval operations, data communication operations, control operations, etc.). The functional units 101A, 101B and 101C may be connected to one another and to the input/output unit 103 of the circuit board 100 by conductive interconnect structures (e.g., conductive traces) of the circuit board 100, as indicated schematically by arrows 104a, 104b and 104c in FIG. 1.

Figure 2A:
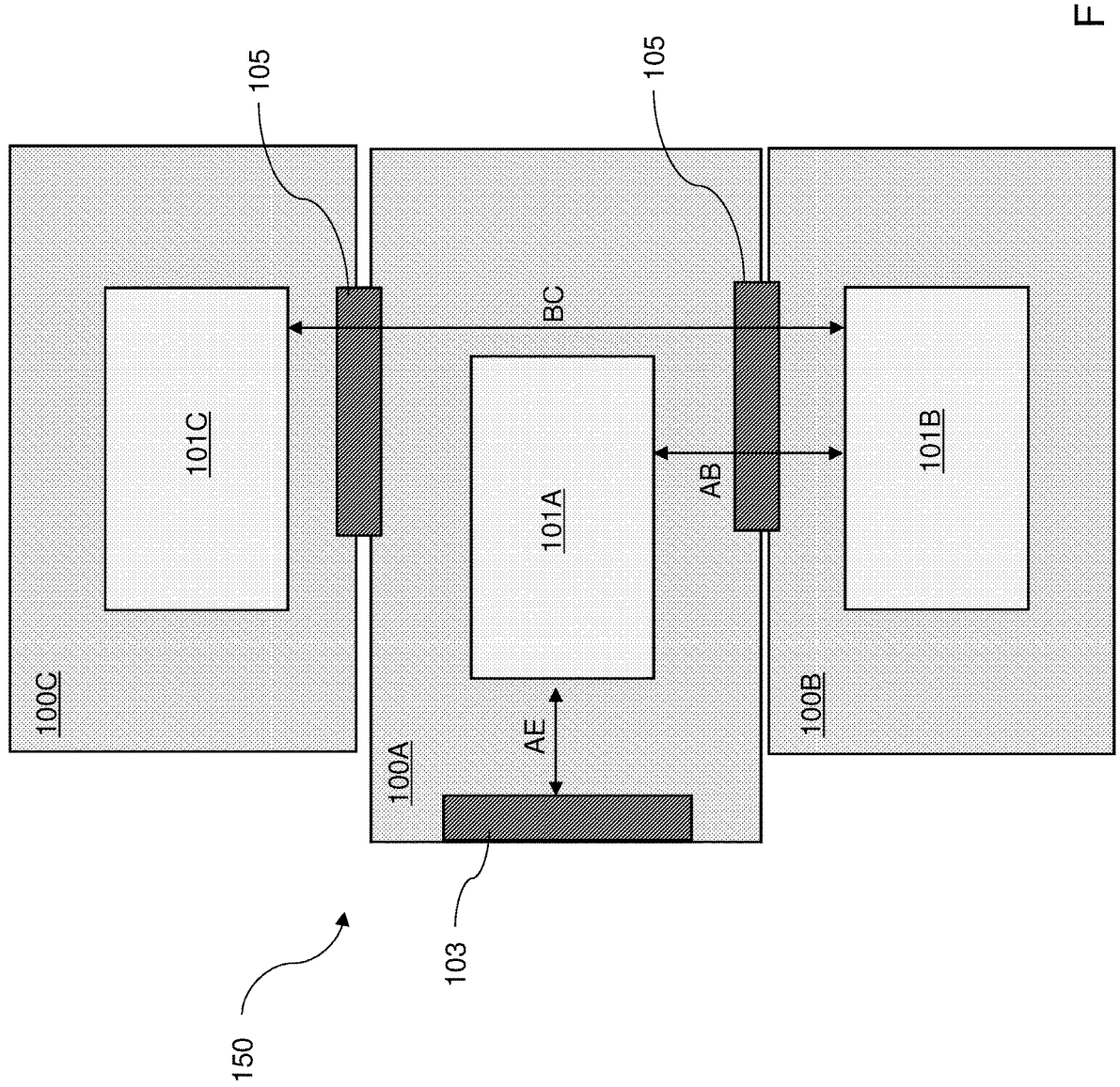
FIG. 2A schematically illustrates an alternative design of a circuit board assembly including multiple circuit boards according to various embodiments of the present disclosure.

FIG. 1 illustrates multiple functional units 101A, 101B and 101C located on a single board 100. FIG. 2A schematically illustrates an alternative design of a circuit board assembly 150 including multiple circuit boards 100A, 100B and 100C. In many electronic systems, such as complex high-speed electronic systems, it may be desirable to provide a circuit board assembly including multiple interconnected circuit boards 100A, 100B and 100C, where the various functional units 101A, 101B and 101C of the assembly may be located on different circuit boards 100A, 100B and 100C. For example, limitations in the available space (or "real estate") within an electronic system may lead to the use of multiple smaller circuit boards 100A, 100B and 100C to provide the same functionality as a single larger circuit board 100 shown in FIG. 1. In addition, distributing different functional units 101A, 101B and 101C amongst several different circuit boards 100A, 100B and 100C may promote modularity and/or scalability in the design of the electronic system. For example, individual circuit boards 100A, 100B and 100C of a multi-board assembly 150 may be removed and replaced with newer or upgraded versions of particular functional units 101A, 101B, 101C without requiring the entire assembly 150 to be replaced. Also, circuit boards 100A, 100B, 100C that are configured to perform specific functions may have applicability across different types of electronic systems. Thus, the same or similar circuit board designs may be used in multiple different products or product families as a component of a multi-board assembly 150, which may reduce design time and in turn help products reach the market in a shorter time-frame.

Figure 2C:
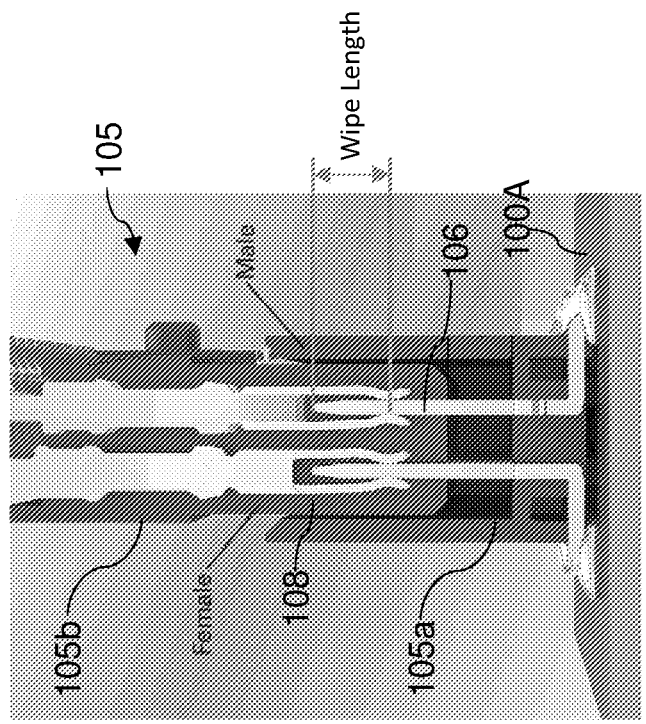
FIG. 2C is a cross-section view of the inter-board connector of FIG. 2B.
Figure 2B:
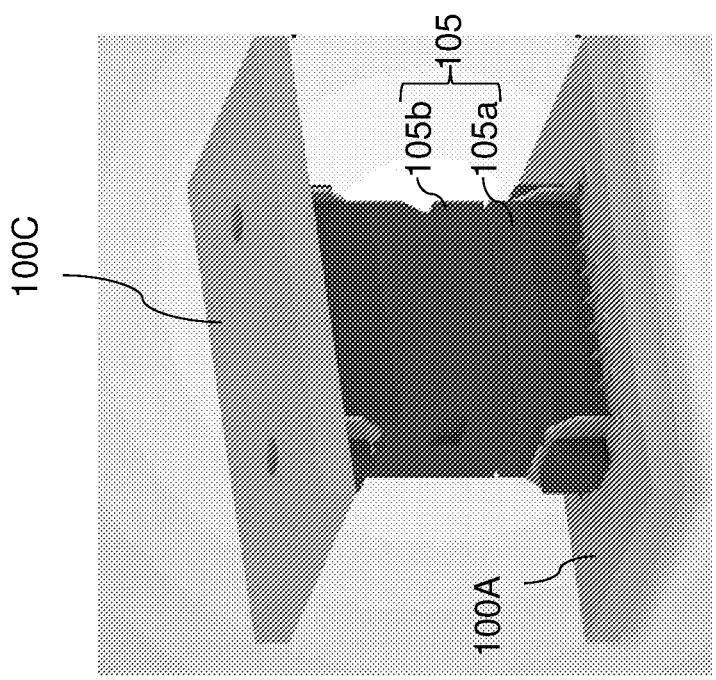
FIG. 2B is a perspective view of an exemplary inter-board connector that may be used to couple two circuit boards of a multi-board assembly according to various embodiments of the present disclosure.

In the embodiment circuit board assembly 150 shown in FIG. 2A, a first circuit board 100A includes an input/output unit 103 (e.g., a connector) for electrically coupling the circuit board assembly 150 to external components and/or devices. The first circuit board 100A that includes the input/output unit 103 for the assembly 150 may also be referred to as a main board or a motherboard. One or more additional circuit boards 100B and 100C, which may also be referred to as daughter boards or daughter cards, may be coupled to the main board 100A via inter-board connectors 105. FIGS. 2B and 2C are perspective and cross-section views, respectively, of an exemplary inter-board connector 105 that may be used to couple two circuit boards 100A, 100B and/or 100C of a multi-board assembly 150. Referring to FIGS. 2B and 2C, the inter-board connector 105 includes a first portion 105a located on a first circuit board 100A and a second portion 105b located on another circuit board 100C. The first portion 105a and the second portion 105b of the inter-board connector 105 may be mated together to bring first electrical connectors 106 on the first portion 105a into electrical contact with second electrical connectors 108 on the second portion 105b. The first portion 105a may be a female portion and the second portion 105b may be a male portion or vice-versa. The first electrical contacts 106 may be male connectors (e.g., pins, prongs, etc.) and the second electrical contacts 108 may be female connectors (e.g., sockets or receptacles), or vice-versa. A characteristic of an inter-board connector 105 as shown in FIGS. 2B and 2C is the "wipe length" of the connector 105, which is the length of the portion of the electrical contacts 106 and 108 that touch ("wipe") between the initial point of engagement between the contacts 106 and 108 and the point of at which the contacts 106 and 108 fully mated. In some cases, a high-speed inter-board connector 105 may be used to couple circuit boards 100A, 100B, 100C of a multi-board assembly 150, such as a Lynx™ board-to-board connector from Amphenol Corporation of Wallingford, CT, USA. Such high-speed connectors 105 may have relatively short wipe lengths, such as less than about 1 mm, including about 0.5 mm.

Figure 2D:
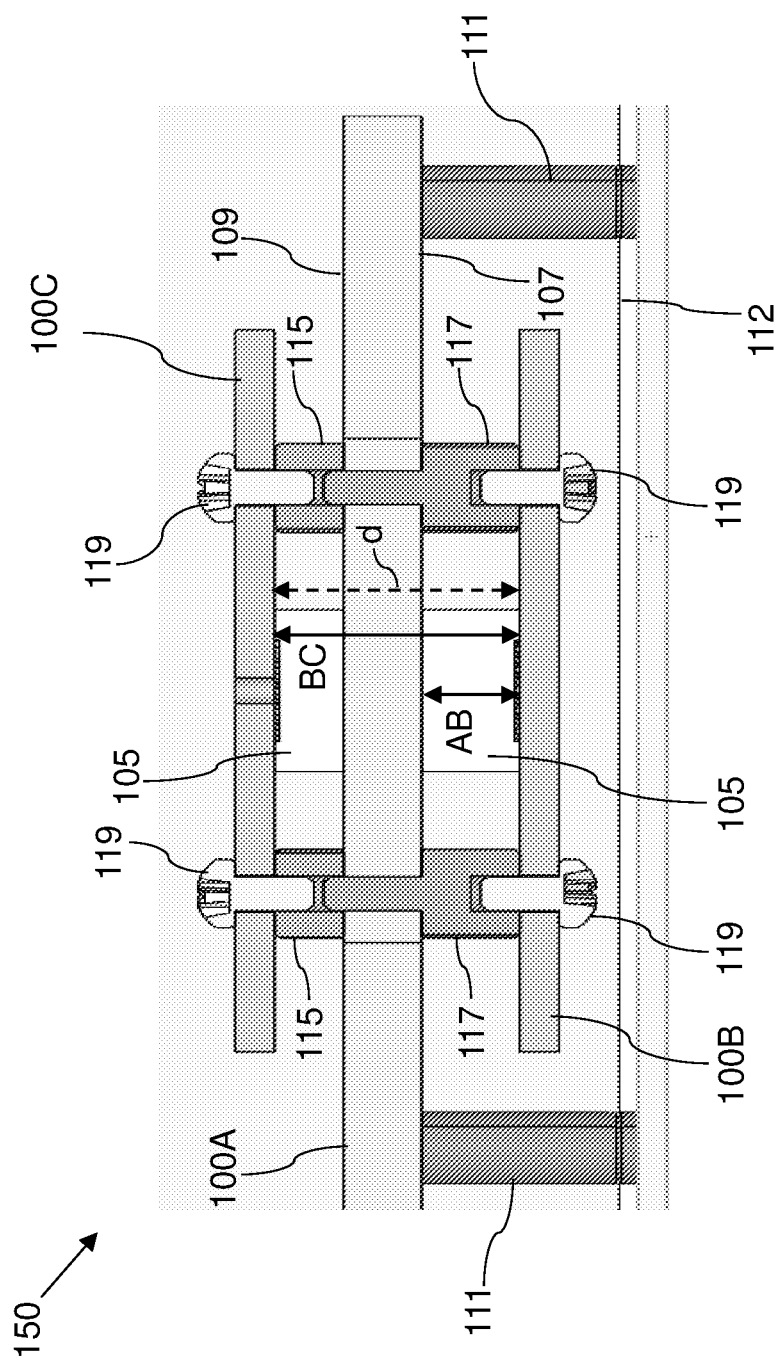
FIG. 2D is a vertical cross-section view of an example of a multi-board assembly that includes a bottom daughter board disposed over a lower surface of a main board and a top daughter board disposed over an upper surface of the main board.

From a space optimization standpoint, it may be advantageous to provide a multi-board assembly 150 in a stacked configuration in which the daughter boards 100B and 100C are located over two opposite major surfaces of the main board 100A. FIG. 2D is a vertical cross-section view of one example of a multi-board assembly 150 that includes a bottom daughter board 100B disposed over a major lower surface 107 of the main board 100A and a top daughter board 100C disposed over a major upper surface 109 of the main board 100A. As used herein, "top" and "bottom" are relative terms which are used to describe opposing sides of the major surfaces of the main board 100A. It should be understood that the main board 100A may be arranged with either major surface, any edge surface, or diagonal direction pointing toward the ground. Thus, "bottom" does not necessarily refer to a side facing the ground. A plurality of standoffs 111 may be coupled to the main board 100A by suitable fasteners (e.g., screws, not shown in FIG. 2D) and may support the assembly 150 over a support base 112, which may be the lower surface of a sheet-metal chassis or enclosure. In some embodiments, the standoffs 111 may be self-clinching standoffs. A plurality of first board standoffs 115 may be located over the upper surface 109 of the main board 100A and may maintain a vertical spacing between the upper surface 109 of the main board 100A and the major lower surface of the top daughter board 100C. A plurality of second board standoffs 117 may be located over the lower surface 107 of the main board 100A and may maintain a vertical spacing between the lower surface 107 of the main board 100A and the major upper surface of the bottom daughter board 100B. The first board standoffs 115 may be female standoffs having internal threads. The second board standoffs 117 may be male/female standoffs that include externally-threaded male portions that extend through an opening in the main board 100A and engage with the internal threads of a corresponding first board standoff 115. Alternatively, the second board standoffs 117 may be female standoffs and the first board standoffs 115 may be male/female standoffs that include externally-threaded male portions that extend through an opening in the main board 100A and engage with the internal threads of a corresponding second board standoff 117. Threaded fasteners 119 (e.g., screws) may be inserted through openings in the top daughter board 100C and the bottom daughter board 100B into the first board standoffs 115 and the internally-threaded female portions of the second board standoffs 117 to secure the top daughter board 100C and the bottom daughter board 100B to the assembly 150. A first inter-board connector 105 connects the main board 100A to the bottom daughter board 100B, and a second inter-board connector 105 connects the main board 100A to the top daughter board 100C.

Referring to FIGS. 2A and 2D, the signal flow in the multi-board assembly 150 is indicated by arrows AE, AB and BC. Arrow AE schematically illustrates signal flow between external I/O unit 103 (not visible in FIG. 2D) and the main board 100A. Arrow AB schematically illustrates signal flow between the main board 100A and the bottom daughter board 100B via a first inter-board connector 105. Arrow BC schematically illustrates signal flow between the bottom daughter board 100B and the top daughter board 100C via the first inter-board connector 105, the main circuit board 100A, and a second inter-board connector 105.

The configuration of a multi-board assembly 150 shown in FIGS. 2A and 2D is not optimized from a signal flow standpoint because signals sent between the bottom daughter board 100B and the top daughter board 100C must pass through two separate inter-board connectors 105 as well as over conductive traces extending through and/or over main board 100A. This may result in a higher signal attenuation and reduced signal integrity (SI).

An alternative approach is to utilize a design that provides a direct inter-board connection between the bottom daughter board 100B and the top daughter board 100C. For example, the assembly of FIG. 2D may be modified to provide a cutout region in the main board 100A such that an inter-board connector 105 may extend through the cutout region between the upper surface of the bottom daughter board 100B and the lower surface of the upper daughter board 100C. However, this may not be possible due to the mechanical tolerance of the stacked multi-board assembly 150, particularly when the assembly utilizes high-speed connectors 105 having low wipe lengths. Mechanical tolerance is the total amount a dimension may vary within an object or assembly and may be expressed as a difference between the upper and lower dimensional limits. Mechanical tolerance can be a significant design consideration because it is generally not possible to manufacture every component of a system to an exact size. The effects of the accumulated dimensional variation that is allowed by specified dimensions and tolerances of an assembly such as shown in FIG. 2D may be calculated as part of a stack up calculation, such as a worst-case tolerance analysis. A worst-case tolerance analysis is derived by setting the dimensions of specified components to their mechanical tolerance limits to detect the maximum expected variation of a particular measurement. For example, a worst-case tolerance may be calculated for the total distance, d, between the lower surface of the top daughter board 100C and the upper surface of the bottom daughter board 100B in the assembly 150 of FIG. 2D by setting the dimensions of the first board standoffs 115 and the second board standoffs 117 and the thickness dimension of the main circuit board 100A to their respective mechanical tolerance limits.

Alternatively, a statistical tolerance stack up analysis, such as a root sum square (RSS) analysis, may be performed. A root sum square (RSS) analysis is a type of statistical tolerance stack up method that assesses the total tolerance of an assembly. An RSS analysis is based on the assumption that variations in the dimensions of each component of an assembly (e.g., the first board standoffs 115, the second board standoffs 117 and the thickness of the main board 100A in the example of FIG. 2D) follow a normal distribution about a mean dimensional value. The total tolerance of the assembly is calculated by summing the squares of the standard deviations of the dimensions of each individual component and taking the square root of the sum.

The present inventors have determined that modifying a stacked multi-board assembly 150 as shown in FIG. 2D to include an inter-board connector 105 that directly connects the bottom daughter board 100B and the top daughter board 100C may result in an assembly 150 that is not mechanically viable. In particular, mechanical tolerance stack up of the assembly may be close to or even exceed the wipe length of the inter-board connector 105 between the bottom daughter board 100B and the top daughter board 100C. In one non-limiting example, the present inventors have determined that in a multi-board assembly 150 as shown in FIG. 2D, the total stack-up tolerance of the distance, d, between the top daughter board 100C and the upper surface of the bottom daughter board 100B is ±0.58 mm using a worst case method, and ±0.37 mm using an RSS method. Thus, for a high-speed inter-board connector 105 having a low wipe length (e.g., 0.5 mm) there is an unacceptable risk that the connector 105 either will not mate at all or there will be insufficient mating contact between the electrical contacts of the connector 105.

Figure 3A:
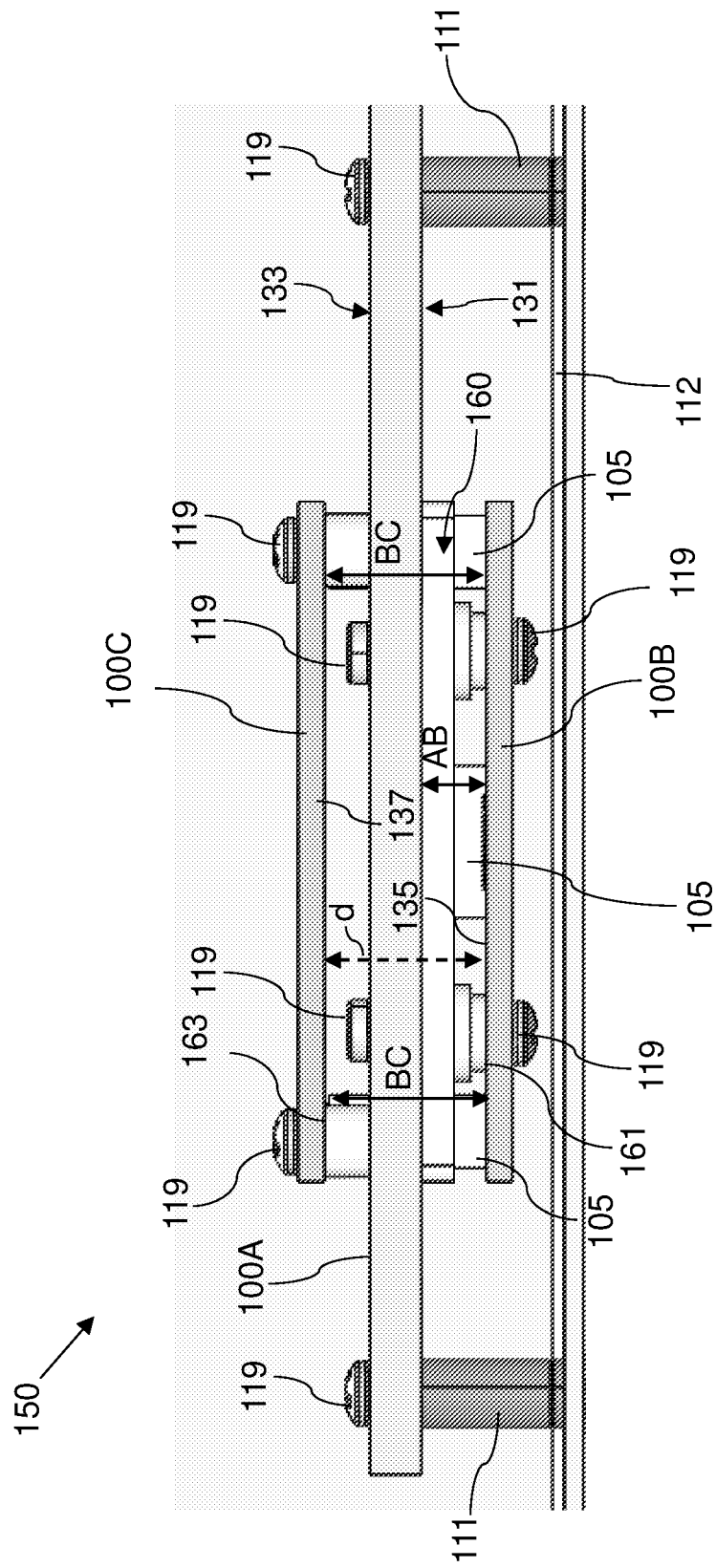
FIG. 3A is a vertical cross-section view of a multi-board assembly including a support element according to an embodiment of the present disclosure.

FIG. 3A is a vertical cross-section view of a multi-board assembly 150 including a support element 160 according to an embodiment of the present disclosure. Referring to FIG. 3A, the multi-board assembly 150 includes a main board 100A, a first (e.g., bottom) daughter board 100B disposed over a first (e.g., bottom) side (e.g., major bottom surface) 131 of the main board 100A, a second (e.g., top) daughter board 100C disposed on a second (e.g., top) side (e.g., major top surface) 133 of the main board 100A, a first connector 105 that provides an electrical connection between the main board 100A and the first daughter board 100B, and a pair of second connectors 105 that provide a direct electrical connection between the first daughter board 100B and the second daughter board 100C. The support element 160 of the multi-board assembly is coupled to the main board 100A, the first daughter board 100B and the second daughter board 100C. A first end 161 of the support element 160 contacts a surface 135 (e.g., the major upper surface 135) of the first daughter board 100B and a second end 163 of the support element 160 contacts a surface 137 (e.g., the major lower surface 137) of the second daughter board 100C. A plurality of mechanical fasteners 119 (e.g., screws) extend through openings in the main board 100A, the first daughter board 100B and the second daughter board 100C and into openings in the support element 160 to secure the main board 100A, the first daughter board 100B and the second daughter board 100C to the support element 160. A plurality of standoffs 111 (e.g., self-clinching standoffs 111) may be coupled to the main board 100A by suitable additional fasteners 119 (e.g., screws) and may support the assembly 150 over a support base 112, which may be the lower surface of a sheet-metal chassis or enclosure.

In the embodiment multi-board assembly 150 of FIG. 3A, the total mechanical tolerance of the distance, d, between the upper surface 135 of the first daughter board 100B and the lower surface 137 of the second daughter board 100B in the assembly corresponds to the dimensional tolerance between the first end 161 of the support element 160 that contacts the upper surface 135 of the first daughter board 100B and the second end 163 of the support element 160 that contacts the lower surface 137 of the second daughter board 100C. In various embodiments, the dimensional tolerance between the first end 161 and the second end 163 of the support element 160 may be less than the wipe length of the second connector(s) 105 that extend between the first daughter board 100B and the second daughter board 100C. In some embodiments, the dimensional tolerance between the first end 161 and the second end 163 of the support element 160 may be less than the wipe length of the second connector(s) 105 by a factor of two or more, such as by a factor of three or more (e.g., by a factor of four or more), including by a factor of five or more. In one non-limiting example, the wipe length of the second connector(s) 105 may be about 0.5 mm, and the dimensional tolerance of the support element 160 between the first end 161 and the second end 163 may be about ±0.1 mm.

Accordingly, various embodiments provide a mechanically viable stacked multi-board assembly 150 including a main board 100A and first and second daughter boards 100B and 100C having major surfaces rather than edge surfaces located on either side of the opposing major surfaces main board 100A. An inter-board connector 105, such as a high-speed connector having a low wipe length, may directly connect the first and second daughter boards 100B and 100C without passing signals through the traces on the main board 100A. This may provide enhanced performance by reducing attenuation of signals transmitted between the first and second daughter boards 100B and 100C and improve signal integrity (SI) of the multi-board assembly 150.

Figure 3B:
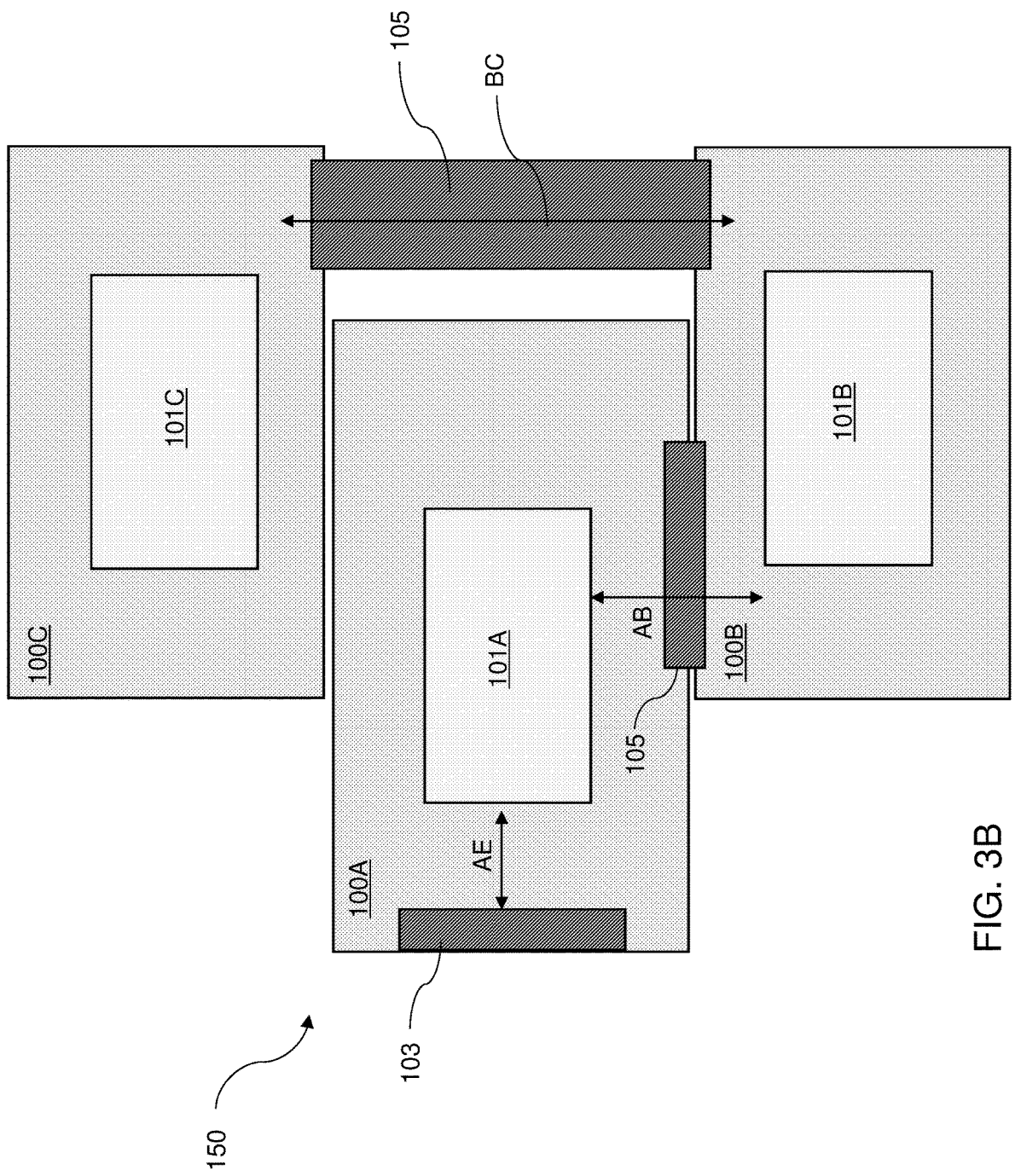
FIG. 3B schematically illustrates signal flow in the multi-board assembly of FIG. 3A according to various embodiments of the present disclosure.

FIG. 3B schematically illustrates the signal flow in an embodiment multi-board assembly 150 as shown in FIG. 3A. Referring to FIGS. 3A and 3B, arrow AE schematically illustrates signal flow between external I/O unit 103 (not shown in FIG. 3A) and the main board 100A. Arrow AB schematically illustrates signal flow between the main board 100A and the bottom daughter board 100B via a first inter-board connector 105. Arrow BC schematically illustrates signal flow between the bottom daughter board 100B and the top daughter board 100C via at least one second inter-board connector 105 that directly connects the bottom daughter board 100B and the top daughter board 100C. In the embodiment shown in FIG. 3A, two inter-board connectors 105 connect the bottom daughter board 100B and the top daughter board 100C, although it will be understood that in other embodiments a single inter-board connector 105, or more than two inter-board connectors 105, may be used to connect the bottom daughter board 100B and the top daughter board 100C.

FIGS. 4A-4C illustrate the support element 160 for the multi-board assembly 150 according to various embodiments of the present disclosure. FIG. 4A is a side elevation view of the support element 160. FIG. 4B is a top perspective view of the support element 160 of FIG. 4A. FIG. 4C is a bottom perspective view of the support element 160 of FIG. 4A. Referring to FIGS. 4A-4C, the support element 160 may be composed of a rigid structural material, such as a metal or a metal alloy. Other suitable materials for the support element 160 are within the contemplated scope of disclosure. In some embodiments, the support element 160 may be formed as an integral component using a suitable manufacturing technique, such as via machining, molding and/or additive manufacturing processes. Alternatively, the support element 160 may be formed of two or more separate parts. The support element 160 may include a plate-like central member 164 having a flat upper surface 165 (i.e., the surface which faces the top daughter board 100C). The central member 164 may include one or more cutout regions 173. At least some of the cutout regions 173 may be sized and shaped to accommodate an inter-board connector 105 as described in further detail below. In some embodiments, the central member 164 may include one or more openings 171, such as threaded openings, extending through the central member 164 that may be used to secure the support element 160 to a main board 100A in a multi-board assembly 150.

One or more first board fixing features 166 may extend from a lower surface 174 (i.e., the surface which faces the bottom daughter board 100B) of the central member 164. The first board fixing features 166 may have a flat lower surface 161 that may form the lower surface 161 of the support element 160. Each of the first board fixing features 166 may have an opening 167 (e.g., a threaded opening) extending through the first board fixing feature 166. In the embodiment shown in FIGS. 4A-4C, the first board fixing features 166 have a stepped cylindrical shape with a diameter that decreases away from the lower surface 174 of the central member 164. As shown in FIG. 4B, the central member 164 may include countersinks surrounding the openings 167 through the first board fixing features 166 in the upper surface 165 of the central member 164. Other suitable configurations for the first board fixing features 166 are within the contemplated scope of disclosure. In addition, while the embodiment of FIGS. 4A-4C illustrates two first board fixing features 166, it will be understood that in other embodiments, the support element 160 may include more than or less than two first board fixing features 166.

One or more second board fixing features 168 may extend from the upper surface 165 of the central member 164. The second board fixing features 168 may have a flat upper surface 163 that may form the upper surface 163 of the support element 160. Each of the second board fixing features 168 may have an opening 169 (e.g., a threaded opening) extending through the second board fixing feature 168. In the embodiment shown in FIGS. 4A-4C, the second board fixing features 168 have a cylindrical shape. Other suitable configurations for the second board fixing features 168 are within the contemplated scope of disclosure. In addition, while the embodiment of FIGS. 4A-4C illustrates four second board fixing features 168 located in four corner regions of the support element 160, it will be understood that in other embodiments, the support element 160 may include more than or less than four second board fixing features 168 that may be located in different regions of the support element 160.

Referring to FIG. 4A, the support element 160 may include a height dimension, h, between the lower surfaces 161 of the first board fixing features 166 and the upper surfaces 163 of the second board fixing features 168. In some embodiments, the mechanical tolerance of the height dimension, h, of the support element 160 may be less than 0.25 mm, such as about 0.1 mm or less.

Figure 5C:
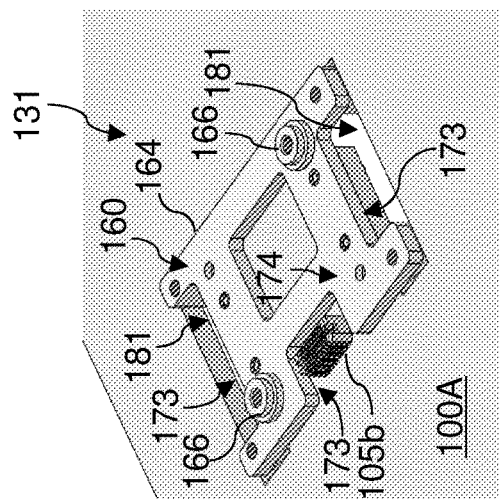
FIGS. 5A-5H are sequential perspective views illustrating a process for assembling a multi-board assembly using a support element according to various embodiments of the present disclosure.
Figure 5B:
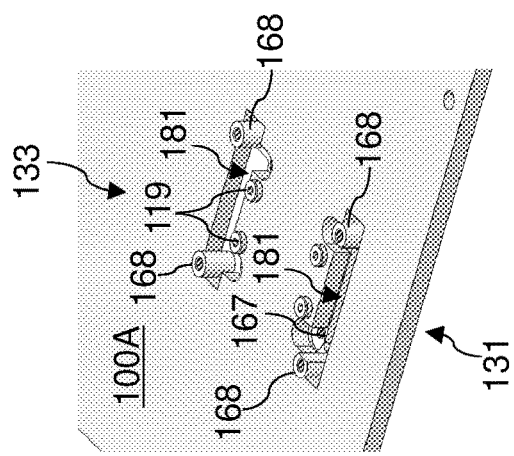
Figure 5A:
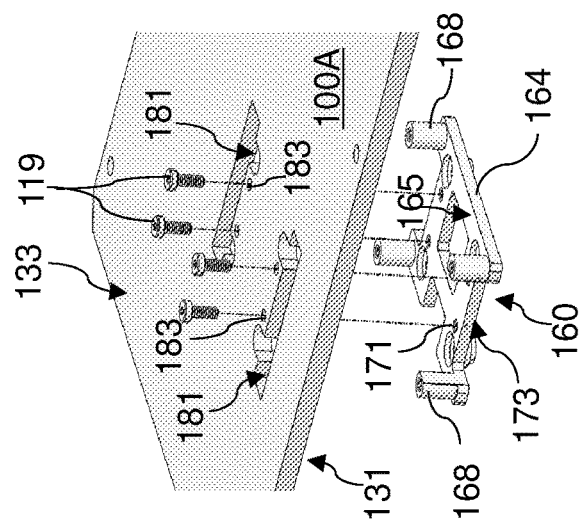

FIGS. 5A-5H are sequential perspective views illustrating a process for assembling a multi-board assembly 150 using an above-described support element 160 according to various embodiments of the present disclosure. FIGS. 5A and 5B illustrate the mounting of the support element 160 to the main board 100A. Referring to FIGS. 5A and 5B, the main board 100A may include cutout regions 181 and openings 183 adjacent to each of the cutout regions 181. The support element 160 may be contacted against the main board 100A such that the flat upper surface 165 of the central member 164 of the support element 160 contacts the major lower surface 131 of the main board 100A and each of the second board fixing features 168 of the support element 160 extends through a cut-out region 181 of the main board 100A. Mechanical fasteners 119 (e.g., screws) may be inserted through the respective openings 183 in the main board 100A and corresponding openings 171 in the underlying central member 164 of the support element 160 to secure the support element 160 to the main board 100A. Although the embodiment of FIGS. 5A-5H illustrates the support element 160 secured to the main board 100A using a plurality of screws 119, it will be understood that the support element may be mounted to the main board 100A using any suitable fastener(s), such as rivets, broaching fasteners and/or solder material.

In the embodiment of FIGS. 5A-5H, the main board 100A includes two generally rectangularly-shaped cutout regions 181 extending parallel to one another. A pair of second board fixing features 168 of the support element 160 may extend through each cutout region 181 of the main board 100A at opposite ends of the respective cutout regions 181. A cutout region 173 of the central member 164 of the support element 160 may be located between the respective pairs of second board fixing features 168 and may underlie a corresponding cutout region 181 of the main board 100A. The cutout regions 181 of the main board 100A may also include convex bulging regions that extend out from the sides of the generally rectangularly-shaped cutout regions 181, and the openings 167 through the second board fixing features 166 of the support element 160 may be exposed through the convex bulging regions of the cutout regions 181 of the main board 100A, as shown in FIG. 5B.

FIG. 5C is a perspective view of the lower surface 131 of the main board 100A illustrating the support element 160 mounted thereto. Referring to FIG. 5C, a second mating portion 105b of an above-described inter-board connector 105 may be located on the lower surface 131 of the main board 100A between the pair of cutout regions 181 of the main board 100A. The second mating portion 105b of the inter-board connector 105 may be located within a cutout region 173 of the central member 164 of the support element 160. FIG. 5C additionally illustrates the second board fixing regions 166 extending from the lower surface 174 of the central member 164 of the support element 160, and the cutout regions 173 of the central member 164 underlying the corresponding cutout regions 181 of the main board 100A to provide continuous openings extending through the main board 100A and the support element 160.

Figure 5F:
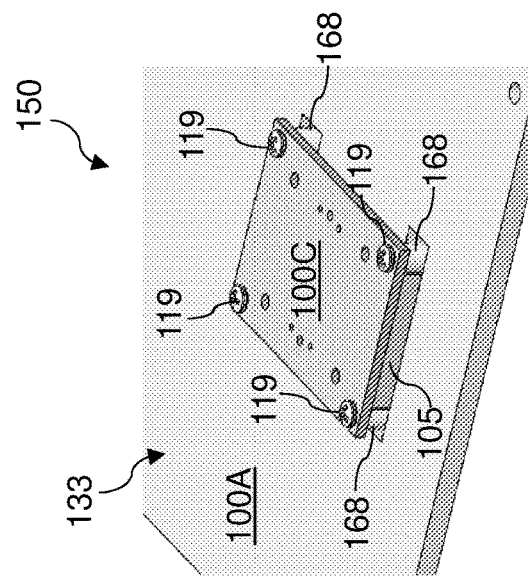
Figure 5E:
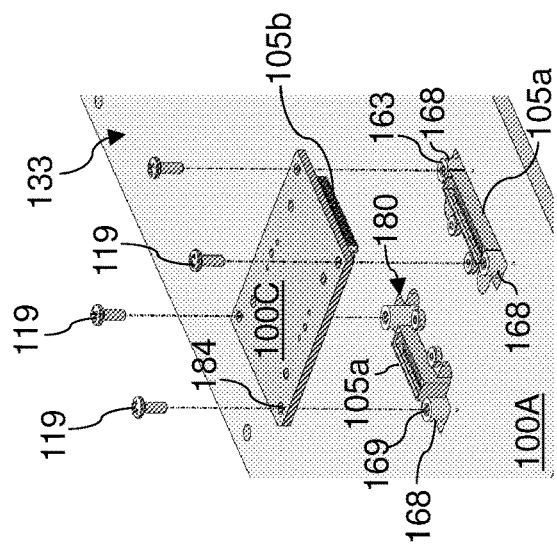
Figure 5D:
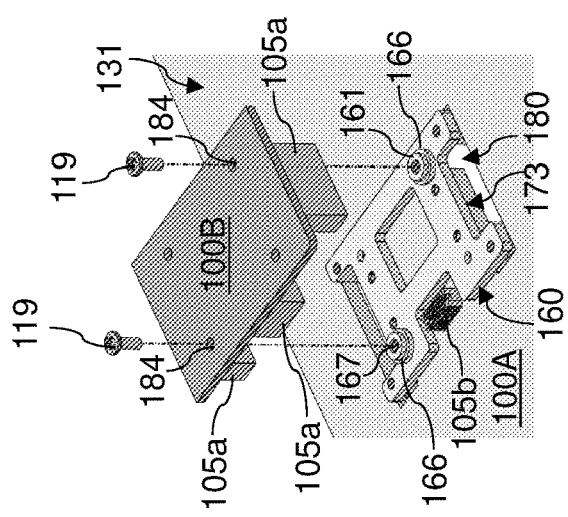

FIG. 5D illustrates a process of mounting of the first (i.e., bottom) daughter board 100B to the multi-board assembly 150 according to various embodiments of the present disclosure. Referring to FIG. 5D, the first daughter board 100B may be brought into contact with the support element 160 such that the surface of the first daughter board 100B facing the support element 160 contacts against the lower surfaces 161 of the first board fixing features 166. A first mating portion 105a of an inter-board connector 105 located on the first daughter board 100B may mate with the second mating portion 105b of the inter-board connector 105 located on the main board 100A, thereby electrically connecting the first daughter board 100B to the main board 100A. The first daughter board 100B may further include a pair of additional first mating portions 105a of inter-board connectors 105 that may be inserted through the respective openings defined by the cutout regions 173 of the central member 164 of the support element 160 and the cutout regions 181 of the main board 100A. Mechanical fasteners 119 (e.g., screws) may be inserted through openings 184 in the first daughter board 100B and the openings 167 in the first board fixing features 166 of the support element 160 to secure the first daughter board 100B to the support element 160.

FIGS. 5E and 5F illustrate a process of mounting of the second (i.e., top) daughter board 100C to the multi-board assembly 150 according to various embodiments of the present disclosure. Referring to FIGS. 5E and 5F, the second daughter board 100C may be brought into contact with the upper surfaces 163 of the second board fixing features 166 of the support element 160. Second mating portions 105b of a pair of inter-board connectors 105 located on the second daughter board 100C may mate with the corresponding first mating portions 105a of the inter-board connectors 105 on the first daughter board 100B that extend through the cutout regions 181 of the main board 100A, thereby electrically connecting the first daughter board 100B to the second daughter board 100C. Mechanical fasteners 119 (e.g., screws) may be inserted through openings 184 in the second daughter board 100C and the openings 169 in the second board fixing features 168 of the support element 160 to secure the second daughter board 100C to the support element 160, and thereby provide a multi-board assembly 150 including a main board 100A and first and second daughter boards 100B and 100C located over opposing major sides of the main board 100A.

Figure 5H:
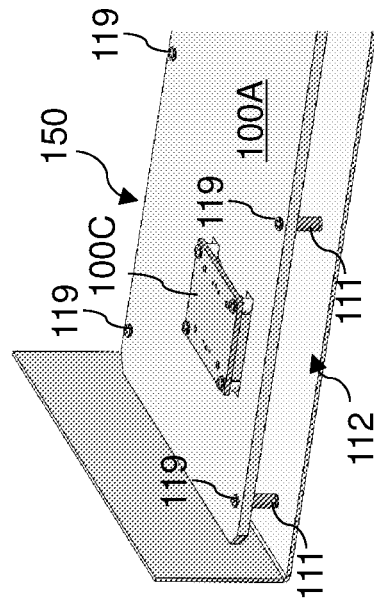
Figure 5G:
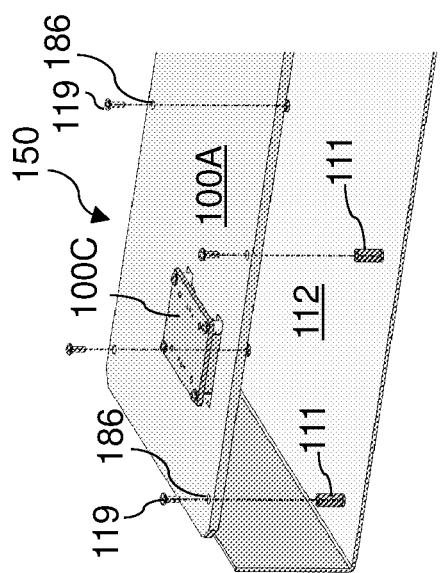

FIGS. 5G and 5H illustrate a process of mounting of the multi-board assembly 150 onto a base chassis 112 according to various embodiments of the present disclosure. Referring to FIGS. 5G and 5H, a plurality of standoffs 111 (e.g., self-clinching standoffs 111) extend from the lower surface of the base chassis 112. The multi-board assembly 150 may be disposed over the base chassis 112 such that the lower surface of the main board 100A contacts the upper surfaces of the plurality of standoffs 111. Mechanical fasteners 119 (e.g., screws) may be inserted through openings 186 in the main board and into openings in the standoffs 111 to secure the multi-board assembly 150 to the base chassis 112.

Figure 6A:
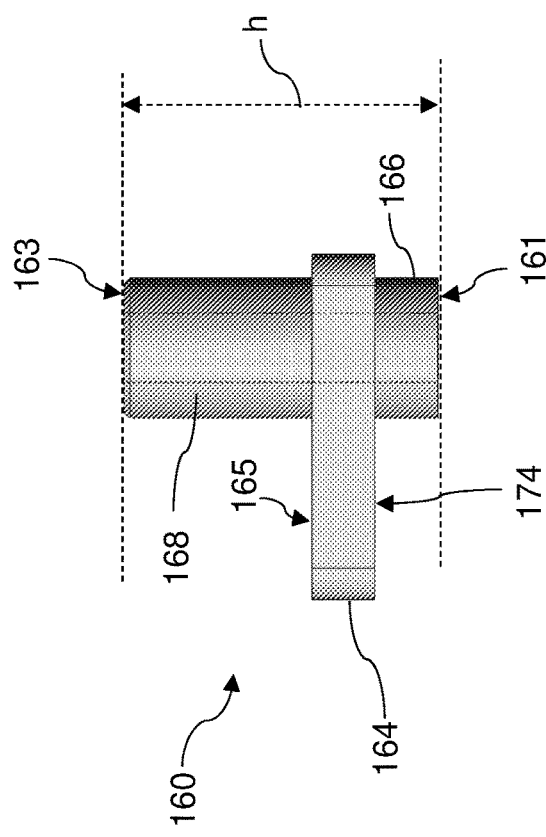
FIG. 6A is a side elevation view of a support element for a multi-board assembly according to an alternative embodiment of the present disclosure.
Figure 6C:
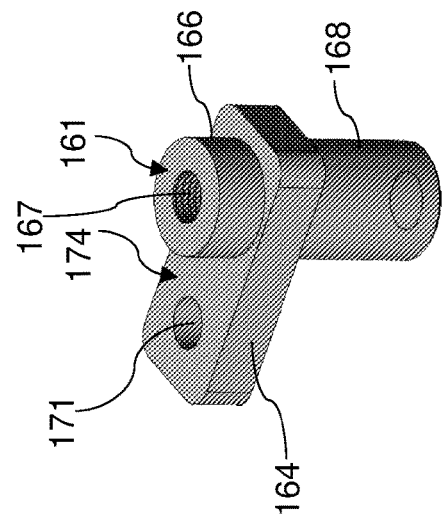
FIG. 6C is a bottom perspective view of the support element of FIG. 6A.
Figure 6B:
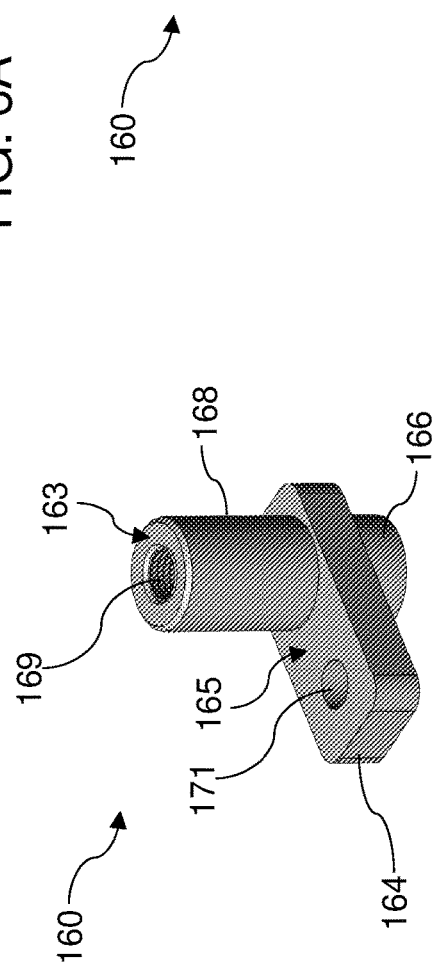
FIG. 6B is a top perspective view of the support element of FIG. 6A.

In some embodiments, a plurality of support members 160 may be used to mount first and second daughter boards 100B and 100C to opposite sides of a main board 100A. FIGS. 6A-6C illustrate a support element 160 for a multi-board assembly 150 according to an alternative embodiment of the present disclosure. FIG. 6A is a side elevation view of the support element 160. FIG. 6B is a top perspective view of the support element 160 of FIG. 6A. FIG. 6C is a bottom perspective view of the support element 160 of FIG. 6A. The support element 160 of FIGS. 6A-6C may differ from the support element 160 described above with reference to FIGS. 4A-4C in that the support element 160 of FIGS. 6A-6C may include a single first board fixing feature 166 extending from a first (e.g., lower) surface 174 of a central member 164, and a single second board fixing feature 168 extending from a second (e.g., upper) surface 165 of a central member 164. In the embodiment of FIGS. 6A-6C, the central member 164 of the support element 160 includes a generally rectangular-shaped member having a flat upper surface 165. The first board fixing feature 166 and the second board fixing feature 168 extending from the respective first (e.g., lower) and second (e.g., upper) surfaces 174 and 165 of the central member 164 may be aligned with one another, such that the central axes of the openings 167 and 169 (e.g., threaded openings) in the first board fixing feature 166 and the second board fixing feature 168 may be colinear. In some embodiments, the openings 167 and 169 may be continuous with one another, such that a single opening may extend continuously through the support element 160 between the lower surface 161 and the upper surface 163 of the support element 160. The first board fixing feature 166 and the second board fixing feature 168 may be offset towards one side of the central member 164. An opening 171 through the central member 164 may be offset towards the opposite side of the central member 164. As in the embodiment of FIGS. 4A-4C, the support element 160 shown in FIGS. 6A-6C may include a height dimension, h, between the lower surface 161 of the first board fixing feature 166 and the upper surface 163 of the second board fixing feature 168. In some embodiments, the mechanical tolerance of the height dimension, h, of the support element 160 may be less than 0.25 mm, such as about 0.1 mm or less.

Figure 7B:
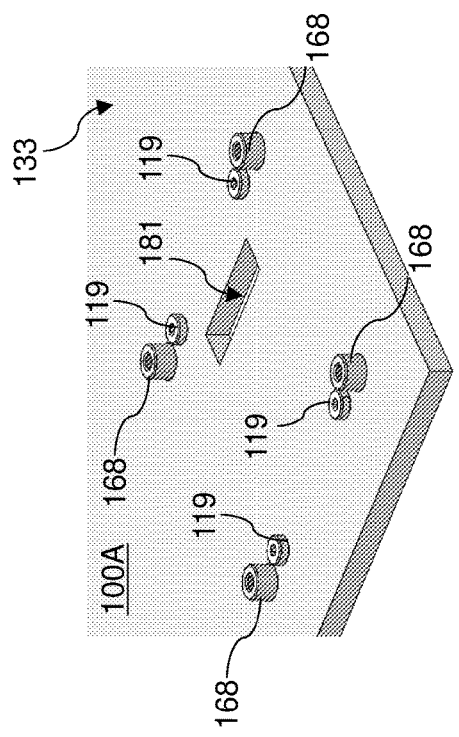
FIGS. 7A and 7B are perspective views illustrating a process of mounting a plurality of support elements to a main board according to various embodiments of the present disclosure.
Figure 7D:
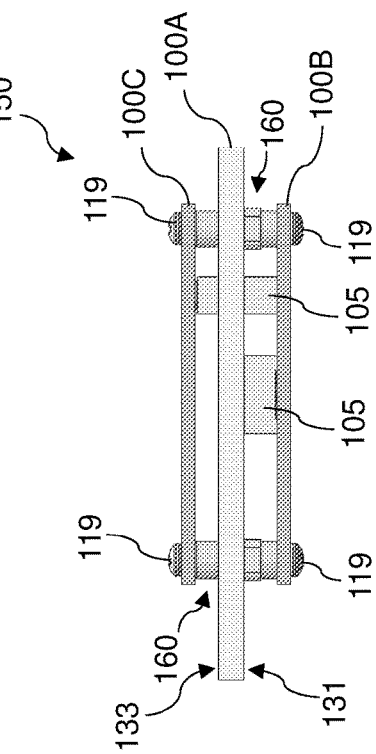
FIGS. 7C and 7D are side elevation views illustrating a process of mounting first and second daughter boards and to a plurality of support elements to provide a multi-board assembly according to various embodiments of the present disclosure.
Figure 7A:
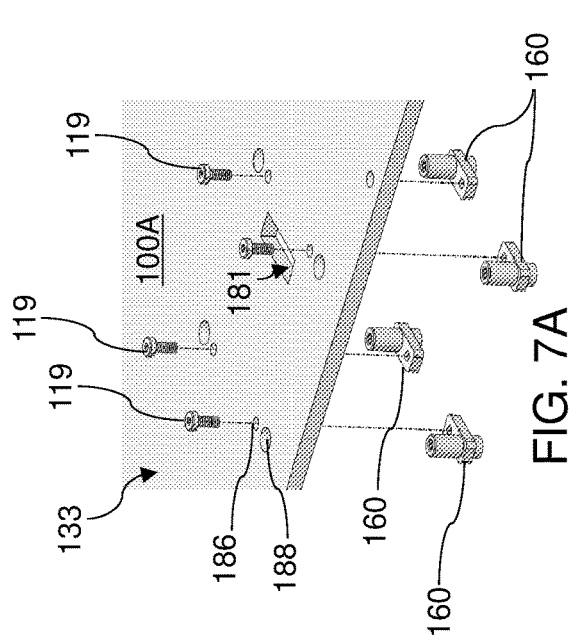

FIGS. 7A-7D illustrate a process for assembling a multi-board assembly 150 using a plurality of support elements 160 as shown in FIGS. 6A-6C according to various embodiments of the present disclosure. FIGS. 7A and 7B are perspective views illustrating a process of mounting a plurality of support elements 160 to a main board 100A. The main board 100A may include a cutout region 181, a plurality of first openings 186 and a plurality of second openings 188 extending through the main board 100A. The second openings 188 may have a larger diameter than the first openings 186. Each second opening 188 may be located adjacent to a first opening 186. A plurality of support elements 160 may be contacted against the main board 100A such that the flat upper surface 165 of the central member 164 of each of the support elements 160 contacts the major lower surface 131 of the main board 100A and the second board fixing feature 168 of each of the support elements 160 extends through the second opening 188 in the main board 100A. Mechanical fasteners 119 (e.g., screws) may be inserted through the respective first openings 186 in the main board 100A and corresponding openings 171 in the underlying central member 164 of each of the support elements 160 to secure the support elements 160 to the main board 100A.

Figure 7C:
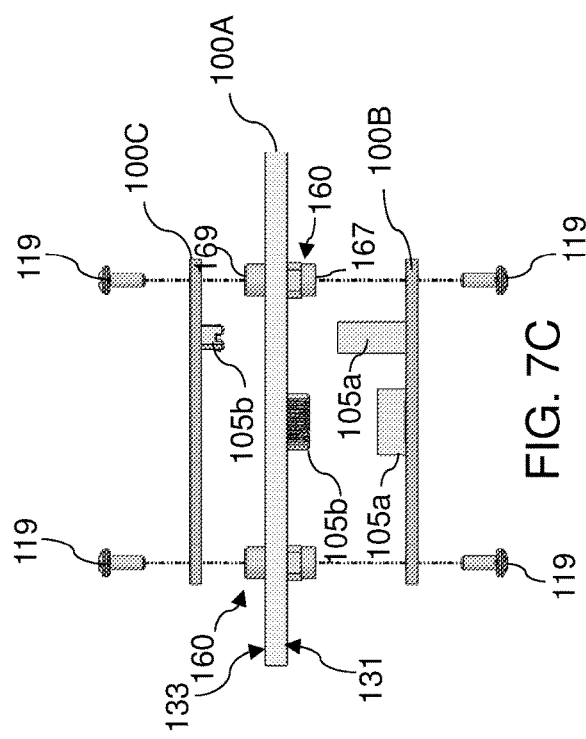

FIGS. 7C and 7D are side elevation views illustrating a process of mounting first and second daughter boards 100B and 100C to the plurality of support elements 160 according to various embodiments of the present disclosure. Referring to FIGS. 7C and 7D, the first daughter board 100B may be brought into contact with the support elements 160 such that the surface of the first daughter board 100B facing the support elements 160 contacts against the lower surface 161 of the first board fixing feature 166 of each of the support elements 160. A second mating portion 105b of an inter-board connector 105 located on the lower surface 131 of the main board 100A may engage and mate with a first mating portion 105a of the inter-board connector 105 located on the upper surface of the first daughter board 100B, thereby electrically connecting the first daughter board 100B to the main board 100A. A first mating portion 105a of an additional inter-board connector 105 located on the upper surface of the first daughter board 100B may extend through the cutout region 181 of the main board 100A. Mechanical fasteners 119 (e.g., screws) may be inserted through openings in the first daughter board 100B and into an opening 167 in the first board fixing feature 166 of each of the support elements 160 to secure the first daughter board 100B to the support elements 160.

The second daughter board 100C may be brought into contact with the upper surface 163 of the second board fixing feature 168 of each of the support elements 160. A second mating portion 105b of an inter-board connector 105 located on the second daughter board 100C may engage and mate with the corresponding first mating portion 105a of the inter-board connector 105 on the first daughter board 100B that extends through the cutout region 181 of the main board 100A, thereby electrically connecting the first daughter board 100B to the second daughter board 100C. Mechanical fasteners 119 (e.g., screws) may be inserted through opening in the second daughter board 100C and into an opening 169 in the second board fixing feature 168 of each of the support element 160 to secure the second daughter board 100C to the support element 160, and thereby provide a multi-board assembly 150 including a main board 100A and first and second daughter boards 100B and 100C located on either side of the main board 100A.

Figure 8C:
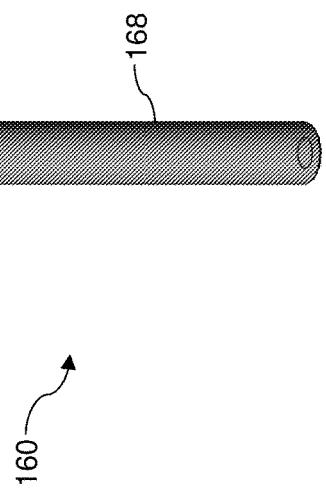
FIG. 8C is a bottom perspective view of the support element of FIG. 8A.
Figure 8A:
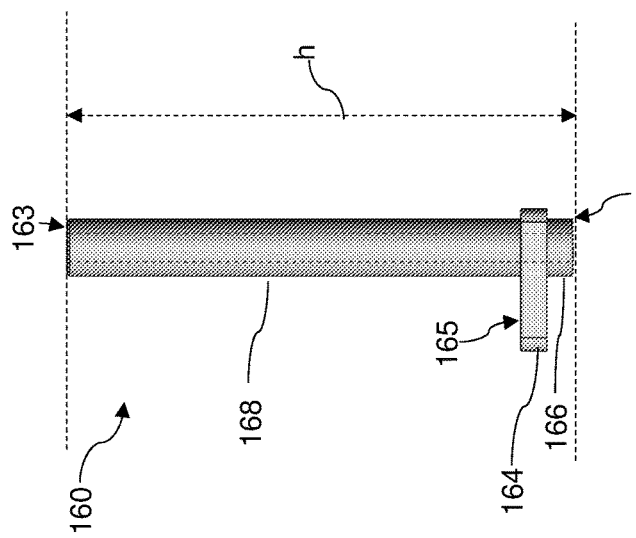
FIG. 8A is a side elevation view of a support element for a multi-board assembly according to yet another embodiment of the present disclosure.
Figure 8B:
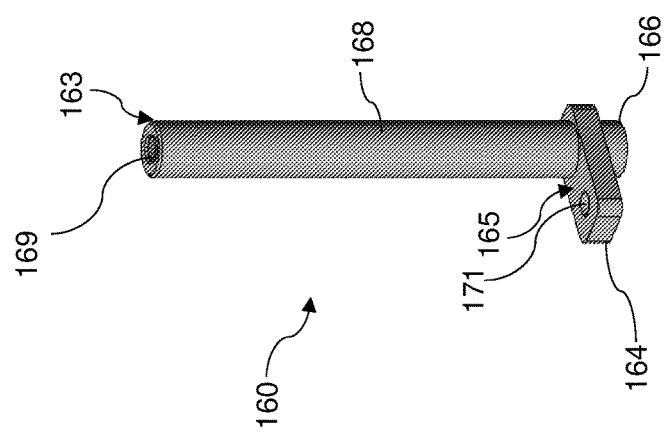
FIG. 8B is a top perspective view of the support element of FIG. 8A.

FIGS. 8A-8C illustrate a support element 160 for a multi-board assembly 150 according to yet another embodiment of the present disclosure. FIG. 8A is a side elevation view of the support element 160. FIG. 8B is a top perspective view of the support element 160 of FIG. 8A. FIG. 8C is a bottom perspective view of the support element 160 of FIG. 8A. The support element 160 of FIGS. 8A-8C may be similar to the support element 160 of 6A-6C, but may have a larger height dimension, h, between the lower surface 161 of the first board fixing feature 166 and the upper surface 163 of the second board fixing feature 168. In particular, the second board fixing feature 168 in the embodiment of FIGS. 8A-8C may be elongated relative to the second board fixing feature 168 in the embodiment of FIGS. 6A-6C. Regardless of variations in the height dimension, h, of the support elements 160, the mechanical tolerances of different sized support elements 160 may be substantially identical. For example, the mechanical tolerance of the height dimension, h, of the support element 160 having an elongated second board fixing feature 168 as shown in FIGS. 8A-8C may be less than 0.25 mm, such as about 0.1 mm or less. The variations in the height dimensions, h, of the support elements 160 may enable the spacing between the different circuit boards 100A, 100B and 100C of a multi-board assembly 150 to be modified while still providing a mechanically viable design.

Figure 9B:
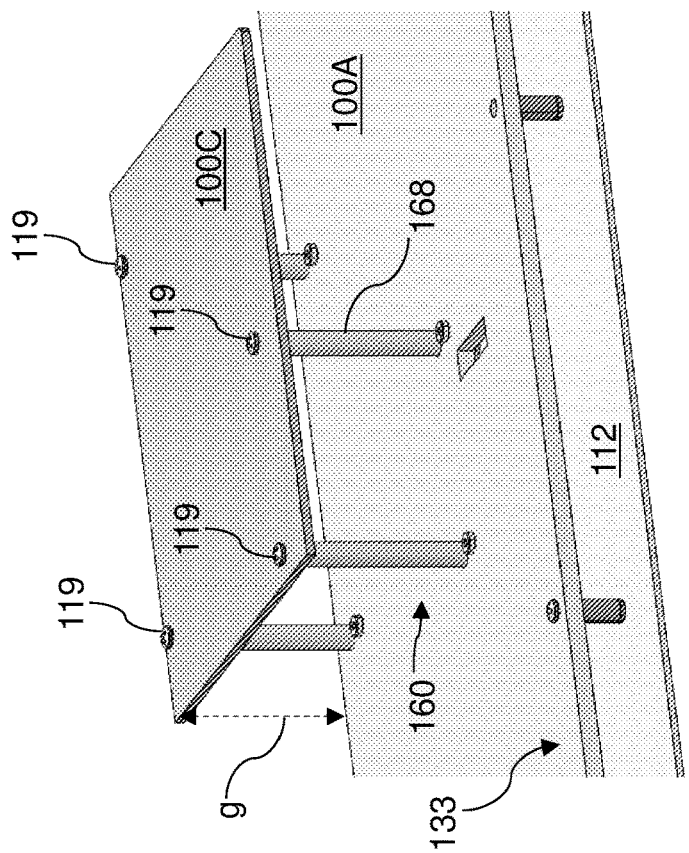
FIGS. 9A and 9B are perspective views illustrating a process of mounting a daughter board to a main board using a plurality of support elements as shown in FIGS. 8A-8C according to an embodiment of the present disclosure.
Figure 9A:
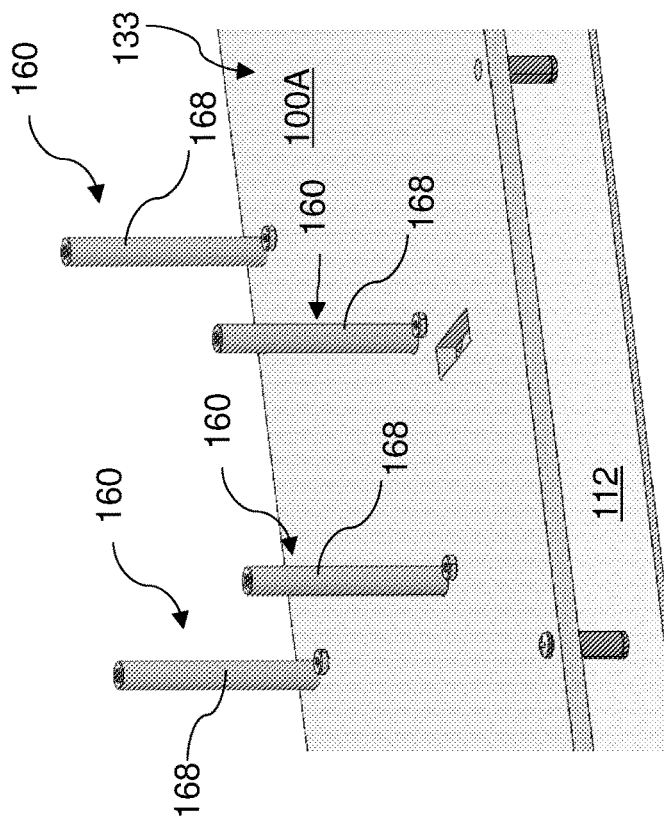

FIGS. 9A and 9B are perspective views illustrating a process of mounting a daughter board 100C to a main board 100A using a plurality of support elements 160 as shown in FIGS. 8A-8C. As is shown in FIG. 9B, the vertical gap, g, between main board 100A and the top daughter board 100C may be greater than in the embodiment multi-board assemblies 150 shown in FIGS. 3A, 5F and 7D. This may be beneficial in instances in which a greater vertical clearance is needed to accommodate other components (e.g., heat sinks, etc.) that are mounted over the surface 133 of the main board 100A. In some embodiments, support elements 160 having multiple vertical height dimensions, h, may be mounted to the main board 100A such that multiple daughter boards 100C may be mounted over the same surface 133 of the main board 100A, where the multiple daughter boards 100C may have different vertical gaps, g, with respect to the surface 133 of the main board 100A. In some embodiments, a respective above-described inter-board connector 105 may connect multiple daughter boards 100C mounted over the same surface 133 of the main board 100A.

Figure 10A:
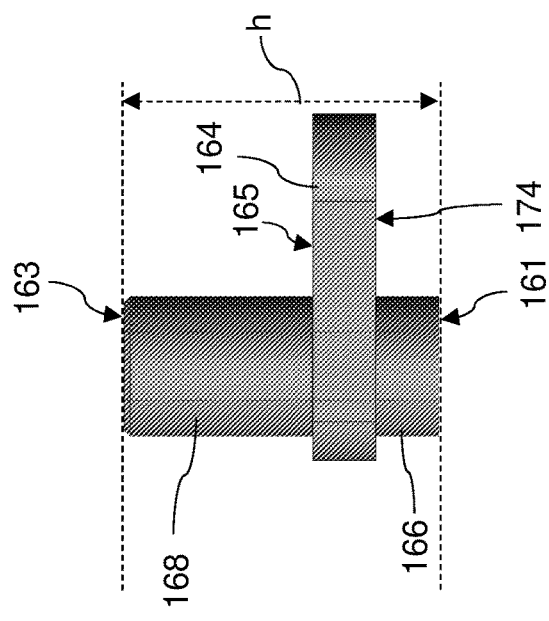
FIG. 10A is a side elevation view of a support element for a multi-board assembly according to an yet another embodiment of the present disclosure.
Figure 10C:
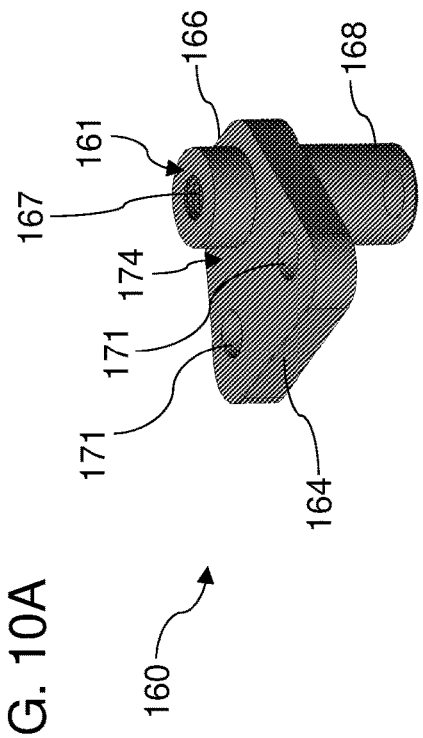
FIG. 10C is a bottom perspective view of the support element of FIG. 10A.
Figure 10B:
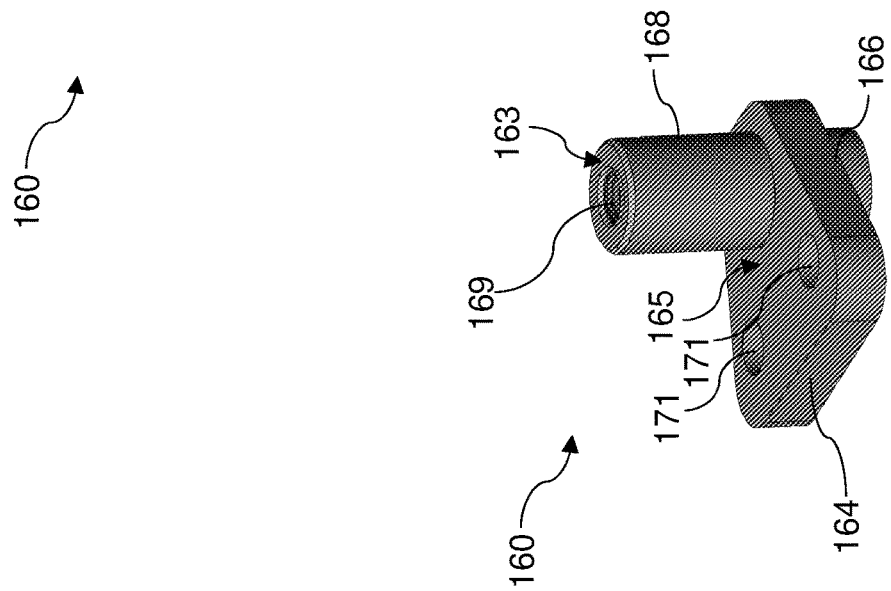
FIG. 10B is a top perspective view of the support element of FIG. 10A.

FIGS. 10A-10C illustrate a support element 160 for a multi-board assembly 150 according to an yet another embodiment of the present disclosure. FIG. 10A is a side elevation view of the support element 160. FIG. 10B is a top perspective view of the support element 160 of FIG. 10A. FIG. 10C is a bottom perspective view of the support element 160 of FIG. 10A. The support element 160 of FIGS. 10A-10C may include a number of similar or identical features as the support element 160 described above with reference to FIGS. 6A-6C. Thus, repeated discussion of like components is omitted for brevity. The support element of FIGS. 10A-10C may differ from the support element 160 of FIGS. 6A-6C in that a plurality of openings 171 (e.g., two openings in the embodiment shown om FIGS. 10A-10C) may extend through the central member 164. In addition, a width dimension of central member 164 may increase from a first side of the support element 160 that includes the first board fixing feature 166 and the second board fixing feature 168 and a second side of the support element 160 that includes the plurality of openings 171 through the central member 164. In the embodiment shown in FIGS. 10A-10C, the central member 164 includes a horizontal cross-section shape similar to an isosceles trapezoid, with the first board fixing feature 166 and the second board fixing feature 168 located proximate to the shorter base of the trapezoid, and a pair of openings 171 spaced apart from one another proximate to the longer base of the trapezoid.

Figure 11A:
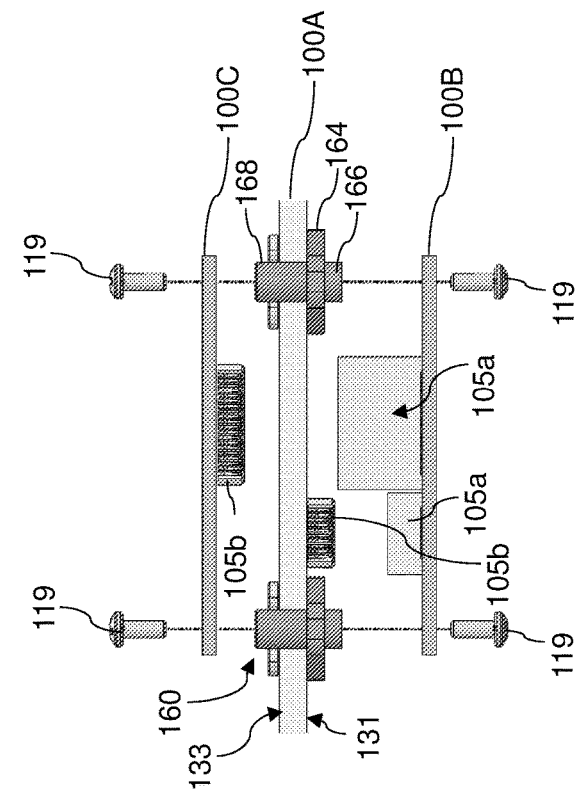
FIG. 11A is a perspective view illustrating a process of mounting a plurality of support elements to a main board such that a first board fixing feature and a second board fixing feature of each support element are located outside of the peripheral edges of the main board according to an embodiment of the present disclosure.

FIGS. 11A-11D illustrate a process for assembling a multi-board assembly 150 using a plurality of support elements 160 as shown in FIGS. 10A-10C according to various embodiments of the present disclosure. FIG. 11A is a perspective view illustrating a process of mounting a plurality of support elements 160 to a main board 100A such that the first board fixing feature 166 and the second board fixing feature 168 of each support element 160 may be located outside of the peripheral edges of the main board 100A. Referring to FIG. 11A, the main board 100A may include a plurality of openings 183 located around peripheral edges of the main board 100A. In some embodiment, the main board 100A may not include an above-described cutout region 181 for accommodating an inter-board connector 105 and may also not include a plurality of second openings 188 configured to accommodate a second board fixing feature 168 of a support element 160. This may result in additional real-estate being available on the main board 100A for other purposes, such as for conductive traces and/or the mounting of components onto the main board 100A. A plurality of support elements 160 may be contacted against the main board 100A around peripheral edges of the main board 100A such that the flat upper surface 165 of the central member 164 of each of the support elements 160 contacts the lower surface 131 of the main board 100A. The first board fixing features 166 and the second board fixing features 168 of the support elements 160 may be located outside the peripheral edges of the main board 100A, as shown in FIG. 11A. Mechanical fasteners 119 (e.g., screws) may be inserted through the openings 183 in the main board 100A and into the openings 171 in the central member 164 of each of the support elements 160 to secure the support elements 160 to the main board 100A.

Figure 11B:
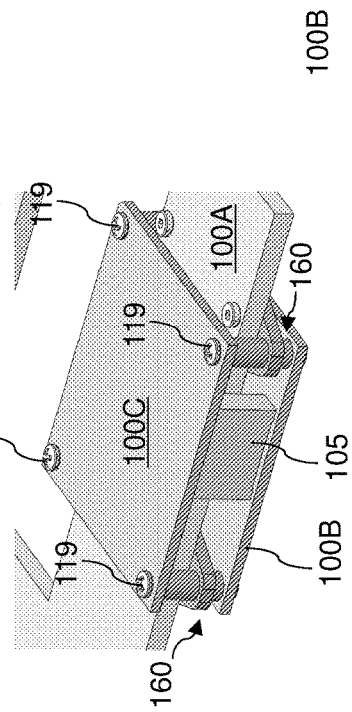
FIG. 11B is a side elevation exploded view of components of a multi-board assembly according to an embodiment of the present disclosure.
Figure 11C:
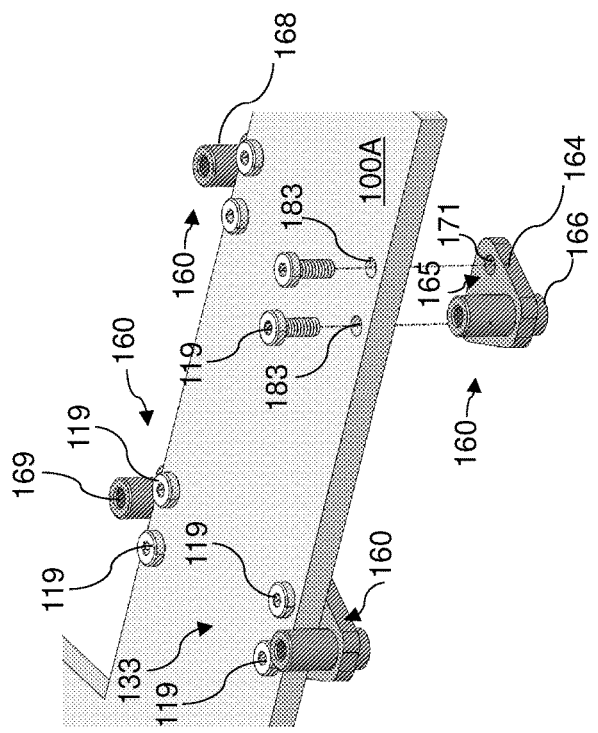
FIG. 11C is a side elevation view of an assembled multi-board assembly according to an embodiment of the present disclosure.
Figure 11D:
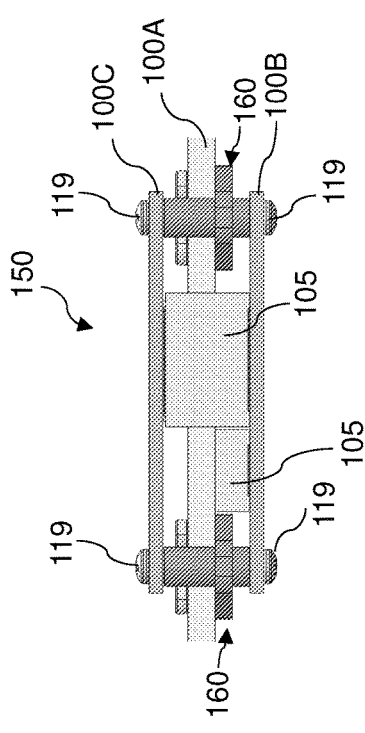
FIG. 11D is a perspective view of the assembled multi-board assembly of FIG. 11C.

FIG. 11B side elevation exploded view of components of a multi-board assembly 150 according to an embodiment of the present disclosure. Referring to FIG. 11B, the mounting of the first and second daughter boards 100B and 100C to the support elements 160 may be similar to the process described above with reference to FIGS. 7C and 7D. Thus, repeated discussion of like elements is omitted for brevity. FIGS. 11C and 11D are a side elevation view and a perspective view, respectively, illustrating the assembled multi-board assembly 150. In the multi-board assembly 150 shown in FIGS. 11C and 11D, portions of the first daughter board 100B and the second daughter board 100C that are secured to the respective first board fixing features 166 and the second board fixing features 168 of the support elements 160 may extend beyond the peripheral edges of the main board 100A. In addition, the inter-board connector 105 that connects the first and second daughter boards 100B and 100C may also be located outside the peripheral edges of the main board 100A.

Accordingly, support elements 160 in accordance with various embodiments of the present disclosure may be utilized in various ways to provide a multi-board assembly 150, depending upon the availability of space and considering any other limitations that may be encountered during product design. Support elements 160 in accordance with various embodiments of the present disclosure may be utilized to provide multi-board assemblies 150 with improved efficiency and/or modularity. The multi-board assemblies 150 in accordance with various embodiments may have lower cost of production due to improved use of real-estate on the circuit boards and the relatively low cost and ease of manufacture of the support elements 160. The use of support elements 160 in accordance with various embodiments may improve the assembly process of multi-board assemblies 150 and products including multi-board assemblies 150 and may enable components to be replaced easily during rework processes within the lab and/or during production. Various embodiments may also facilitate re-use of the same components across multiple products and/or product families, which may help manufacturers in various industries, such as networking, telecommunications and data storage industries, to achieve competitive pricing.

FIGS. 12A-12D illustrate a testing system 300 including a test socket 301 and a universal burn-in board 305 according to another embodiment of the present disclosure. A burn-in board 305 is a specialized circuit board (e.g., PCB) that may be used to perform burn-in testing on electronic components, such as integrated circuit (IC) dies or packages. The burn-in testing may simulate real-world conditions that the component under test may encounter to determine if there defects or faults in the design or performance of the component. The burn-in test procedure may include subjecting the component to stress conditions, such as high-temperatures, high-voltages and/or high operating frequencies, for an extended period to assess the reliability and durability of the component under test. The burn-in board 305 may include electronic components that are used to perform the burn-in testing. In the embodiment of FIGS. 12A-12D, the burn-in board 305 may be a universal burn-in board that may be configured to perform a variety of different types of burn-in test procedures on different electronic components. The testing system 300 may additionally include a control board 307 that may be configured to control the operations of the burn-in board 305. The control board 307 may be mounted over a major first (e.g., lower) surface 304 of the burn-in board 305. An above-described inter-board connector 105 may electrically couple the control board 307 to the burn-in board 305.

Figure 12A:
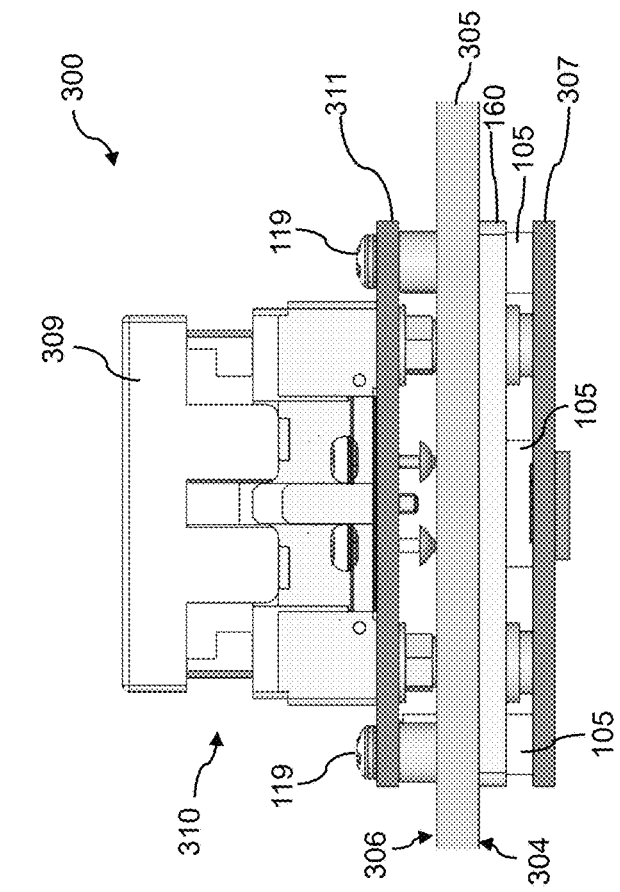
FIG. 12A is a perspective view of a testing system including a test socket and a universal burn-in board according to another embodiment of the present disclosure.
Figure 12B:
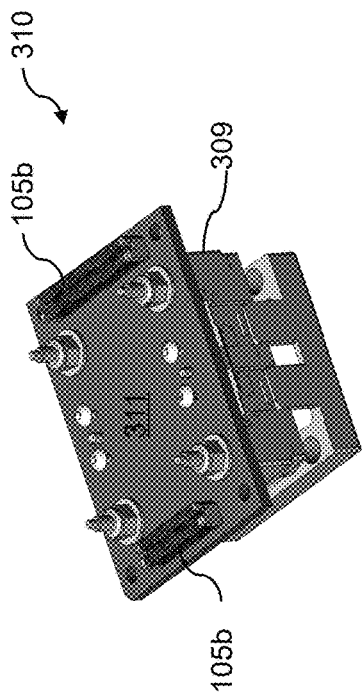
FIG. 12B is a side elevation view of the testing system of FIG. 12A.
Figure 12C:
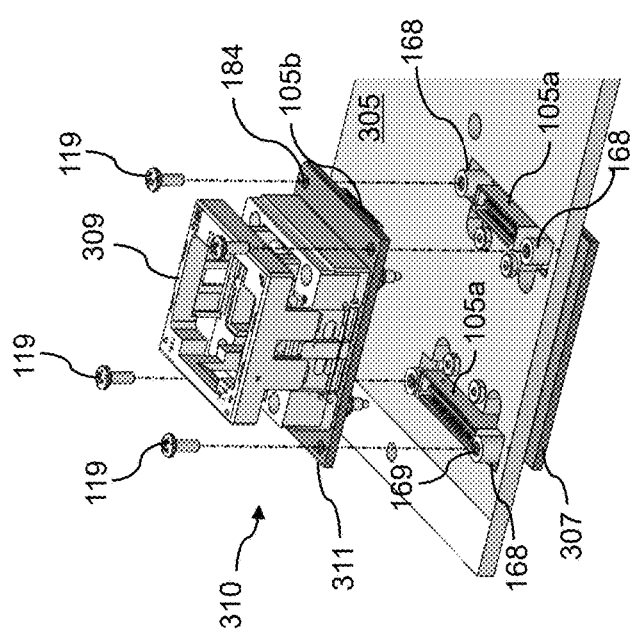
FIG. 12C is a top perspective view illustrating a test socket for a testing system according to an embodiment of the present disclosure.
Figure 12D:
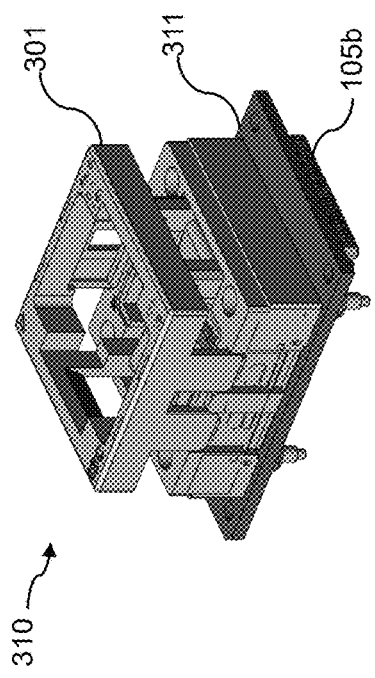
FIG. 12D is a bottom perspective view of the test socket of FIG. 12C.

As shown in FIGS. 12A and 12B, which are perspective and side elevation views of the testing system 300, respectively, an above-described support element 160 may be mounted to the first (e.g., lower) surface 304 of the burn-in board 305. The control board 307 may be mounted to the first board fixing features 166 of the support element 160. Although the embodiment testing system 300 of FIGS. 12A and 12B illustrates a support element 160 as previously described with reference to FIGS. 4A-4C, it will be understood that other support elements 160, such as the support elements 160 described above with reference to FIG. 6A-6C, 8A-8C or 10A-10C, may alternatively be utilized. In some embodiments, at least one first mating portion 105a of an inter-board connector 105 may be located on the upper surface of the control board 307 and may extend through a cutout region 181 of the burn-in board 305, as shown in FIGS. 12A and 12B.

The testing system 300 may further include a test socket assembly 310 including a test socket 309 and a socket board 311. The test socket 309 may be configured to provide a temporary mechanical and electrical interface between the component being tested (e.g., an IC die or package) and the test equipment (i.e., the burn-in board 305 and the control board 307 in the embodiment of FIGS. 12A-12B). The test socket 309 may be mounted on the upper surface of the socket board 311 (e.g., a PCB). At least one second mating portion 105b of an inter-board connector 105 may be located on the lower surface of the socket board 311. The test socket assembly 310 may be mounted over second (e.g., upper) surface 306 of the burn-in board 305 such that the lower surface of the socket board 311 contacts the upper surface 163 of the second board fixing features 168 of the support element 160 and the at least one second mating portion 105b on the socket board 311 mates with the at least one first mating portion 105a on the control board 307, thereby electrically connecting the control board 307 to the test socket assembly 310. Mechanical fasteners 119 (e.g., screws) may extend through openings 184 in the socket board 311 and into the openings 169 in the second board fixing features 168 of the support element 160 to secure the test socket assembly 310 to the support element 160. In various embodiments, a testing system, such as the testing system 300 shown in FIGS. 12A-12D may permit different test sockets 309 and/or test socket assemblies 310 to be used with a universal burn-in board 305, which may reduce design effort, time and cost.

A multi-board assembly 150 including at least one support element 160 according to various embodiments may provide relatively simple assembly and reliable mechanical support without the accumulation or "stacking" of multiple mechanical tolerances. Accordingly, the multi-board assembly 150 may have a reduced overall mechanical tolerance which may allow for the use of high-speed inter-board connectors or other inter-board connectors with low wipe lengths. In various embodiments, by fixing the top and bottom circuit boards 100B and 100C on one or more support elements 160, the top and bottom circuit boards 100B and 100C may be independently assembled and/or removed, which may result in easier and quicker replacement of either the top or the bottom circuit board 100B, 100C. Further, by mounting the at least one support element 160 to the main board 100A and the top and bottom circuit boards 100B and 100C to the upper and lower surfaces of the at least one support element 160, thickness variations in the main board 100A do not contribute to the mechanical tolerance of the multi-board assembly 150.

Referring to all drawings and according to various embodiments of the present disclosure, an electronic assembly 150 including a first circuit board 100A, a support element 160 including a central member 164 mounted to a first surface 131 of the first circuit board 100A, a first board fixing feature 166 extending from a first surface 174 of the central member 164, and a second board fixing feature 168 extending from a second surface 165 of the central member 164 that is opposite the first surface 174, where a first end 161 of the support element 160 is defined by an outer surface 161 of the first board fixing feature 166, and a second end 163 of the support element 160 opposite the first end 161 is defined by an outer surface 163 of the second board fixing feature 168, a second circuit board 100B contacting the first end 161 of the support element 160 and mounted to the first board fixing feature 166, a third circuit board 100C contacting the second end 163 of the support element 160 and mounted to the second board fixing feature 168, a first inter-board connector 105 extending between the first circuit board 100A and the second circuit board 100B, and a second inter-board connector 105 extending between the second circuit board 100B and the third circuit board 100C.

In one embodiment, a wipe length of the second inter-board connector 105 is less than 1 mm. In one embodiment, a wipe length of the second inter-board connector 105 is 0.5 mm or less. In one embodiment, the first surface 131 of the first circuit board 100A is a lower surface 131 of the first circuit board 100A, the central member 164 of the support element 160 includes a flat upper surface 174 that contacts the lower surface 131 of the first circuit board 100A, and the central member 164 of the support element 160 is mounted to the lower surface 131 of the first circuit board 100A by one or more screws, rivets, broaching fasteners, and/or solder material portions.

In one embodiment, the first circuit board 100A includes a cutout region 181, and the second inter-board connector 105 extends within the cutout region 181 between the second circuit board 100B and the third circuit board 100C.

In one embodiment, the support element 160 includes a plurality of first board fixing features 166 extending from a lower surface 174 of the central element 164, each of the first board fixing features 166 including a lower surface 161 that contacts an upper surface of the second circuit board 100B, and a plurality of second board fixing features 168 extending from an upper surface 165 of the central element 164 through a cutout region 181 of the first circuit board 100A, each of the second board fixing features 168 including an upper surface 163 that contacts a lower surface of the third circuit board 100C.

In one embodiment, a pair of second board fixing features 166 are located on opposite sides of the second inter-board connector 105 and extend through the same cutout region 181 of the first circuit board 100A through which the second inter-board connector 105 extends.

In another embodiment, the central element 164 of the support element 160 includes a first cutout region 173 that is sized and shaped to accommodate the first inter-board connector 105 and a second cutout region 173 that is sized and shaped to accommodate the second inter-board connector 105.

In another embodiment, electronic assembly 150 includes a plurality of support elements 160 mounted to the lower surface 131 of the first circuit board 100A, each of the support elements 160 including a central member 164 having a flat upper surface 165 that contacts the lower surface 131 of the first circuit board 100A, a first board fixing feature 166 extending from a lower surface 174 of the central element 164 and having a lower surface 161 that contacts an upper surface of the second circuit board 100B, and a second board fixing feature 168 extending from an upper surface 165 of the central element 164 and having an upper surface 163 that contacts a lower surface of the third circuit board 100C.

In another embodiment, the first board fixing feature 166 and the second board fixing feature 168 of each support element 160 are aligned with one another and offset to one side of the central member 164 of the support element 160.

In another embodiment, the first circuit board 100A includes a plurality of openings 188, and the second board fixing features 168 of each of the support elements 160 extend through an opening 188 in the first circuit board 100A.

In another embodiment, the first board fixing feature 166 and the second board fixing feature 168 of each of the support elements 160 are located outside a peripheral edge of the first circuit board 100A.

In another embodiment, a width dimension of the central member 164 of each of the support elements 160 increases between a first end of the central member 164 proximate to the first board fixing feature 166 and the second board fixing feature 168 and a second end of the central member 164 that contacts the lower surface 131 of the first circuit board 100A.

In another embodiment, the first circuit board is a burn-in board 305 and a test socket 301 is mounted to the third circuit board 311.

In another embodiment, a mechanical tolerance of a height dimension h between the first end 161 and the second end 163 of the support element 160 is less than a wipe length of the second inter-board connector 105 by a factor of two or more.

In another embodiment, the mechanical tolerance of the height dimension h between the first end 161 and the second end 163 of the support element 160 is less than the wipe length of the second inter-board connector 105 by a factor of five or more.

In one embodiment, a method of manufacturing an electronic assembly includes attaching a support element 160 to a first circuit board 100A such that a central member 164 of the support element 160 contacts a first surface 131 of the first circuit board 100A, a first board fixing feature 166 extends from a first surface 174 of the central member 160 and defines a first end 161 of the support element 160, and a second board fixing feature 168 extends from a second surface 165 of the central member 164 and defines a second end 163 of the support element 160, mounting a second circuit board 100B over the first surface 131 of the first circuit board 100A such that a surface of the second circuit board 100B contacts the first end 161 of the support element 160 and a first inter-board connector 105 extends between the first surface 131 of the first circuit board 100A and the surface of the second circuit board 100B, mounting a third circuit board 100C over a second surface 133 of the first circuit board 100A that is opposite the first surface 131 of the first circuit board 100A such that a surface of the third circuit board 100C contacts the second end 163 of the support element 160 and a second inter-board connector 105 extends between the surface of the second circuit board 100B and the surface of the third circuit board 100C.

In another embodiment, mounting the second circuit board 100B over the first surface 131 of the first circuit board 100A includes providing a mechanical fastener 119 through an opening 184 in the second circuit board 100B and into an opening 167 in the first board fixing feature 166, and mounting the third circuit board 100C over the second surface 133 of the first circuit board 100A includes providing a mechanical fastener 119 through an opening 184 in the third circuit board 100C and into an opening 169 in the second board fixing feature 168.

In one embodiment, a support element 160 for a multiple circuit board assembly 150 includes a central member 164 having a planar upper surface 165, a first board fixing feature 166 extending from a lower surface 174 of the central member 164 and including an opening 167 in a lower surface 161 of the first board fixing feature 166, and a second board fixing feature 168 extending from an upper surface 165 of the central member 164 and including an opening 169 in an upper surface 163 of the second board fixing feature 168.

In an embodiment, a mechanical tolerance of a height dimension h between the lower surface 161 of the first board fixing feature 166 and the upper surface 163 of the second board fixing feature 168 is within ±0.1 mm.

The support element 60 may provide a low mechanical tolerance for the assembly 150, which may permit the use of a high-speed connector 105 having a low wipe length to provide a direct electrical connection between the daughter boards 100B and 100C, thereby providing improved signal flow within the stacked circuit board assembly 150.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. An electronic assembly, comprising:
a first circuit board;
a support element comprising a central member mounted to a first surface of the first circuit board, a plurality of first board fixing features extending from a first surface of the central member, and a plurality of second board fixing features extending from a second surface of the central member that is opposite the first surface, wherein a first end of the support element is defined by outer surfaces of the plurality of first board fixing features, and a second end of the support element opposite the first end is defined by outer surfaces of the plurality of second board fixing features;
a second circuit board contacting the first end of the support element and mounted to the plurality of first board fixing features;

a third circuit board contacting the second end of the support element and mounted to the plurality of second board fixing features;
a first inter-board connector extending between the first circuit board and the second circuit board; and
a second inter-board connector extending between the second circuit board and the third circuit board, wherein:
the first surface of the first circuit board comprises a major lower surface of the first circuit board;
the central member of the support element comprises a flat upper surface that contacts the major lower surface of the first circuit board;
the central member of the support element is mounted to the major lower surface of the first circuit board;
the first circuit board comprises a cutout region, and the second inter-board connector extends within the cutout region between the second circuit board and the third circuit board;
the plurality of first board fixing features extend from a lower surface of the central member, each of the first board fixing features comprising a lower surface that contacts an upper surface of the second circuit board;
the plurality of second board fixing features extend from an upper surface of the central member through the cutout region of the first circuit board, each of the second board fixing features comprising an upper surface that contacts a lower surface of the third circuit board; and
a pair of second board fixing features of the plurality of second board fixing features are located on opposite sides of the second inter-board connector and extend through a same cutout region of the first circuit board through which the second inter-board connector extends.

2. The electronic assembly of claim 1, wherein a wipe length of the second inter-board connector is less than 1 mm.

3. The electronic assembly of claim 2, wherein the wipe length of the second inter-board connector is 0.5 mm or less.

4. The electronic assembly of claim 1, wherein the central member of the support element comprises a first cutout region that is sized and shaped to accommodate the first inter-board connector and a second cutout region that is sized and shaped to accommodate the second inter-board connector.

5. The electronic assembly of claim 1, wherein the first circuit board comprises a burn-in board, and a test socket is mounted to the third circuit board.

6. The electronic assembly of claim 1, wherein a mechanical tolerance of a height dimension between the first end and the second end of the support element is less than a wipe length of the second inter-board connector by a factor of two or more.

7. The electronic assembly of claim 6, wherein the mechanical tolerance of the height dimension between the first end and the second end of the support element is less than the wipe length of the second inter-board connector by a factor of five or more.

8. An electronic assembly, comprising:
a first circuit board;
a plurality of support elements, each support element comprising a central member mounted to a first surface of the first circuit board, a first board fixing feature extending from a first surface of the central member, and a second board fixing feature extending from a second surface of the central member that is opposite the first surface, wherein a first end of the support element is defined by an outer surface of the first board fixing feature, and a second end of the support element opposite the first end is defined by an outer surface of the second board fixing feature;
a second circuit board contacting respective first ends of the plurality of support elements and mounted to the first board fixing features;
a third circuit board contacting respective second ends of the plurality of support elements and mounted to the second board fixing features;
a first inter-board connector extending between the first circuit board and the second circuit board; and
a second inter-board connector extending between the second circuit board and the third circuit board, wherein:
the first surface of the first circuit board comprises a major lower surface of the first circuit board;
the central member of each of the plurality of support elements comprises a flat upper surface that contacts the major lower surface of the first circuit board;
the central member of each of the plurality of support elements is mounted to the major lower surface of the first circuit board;
each of the first board fixing features extends from a lower surface of a central member of a support element of the plurality of support elements and has a lower surface that contacts an upper surface of the second circuit board;
each of the second board fixing features extends from an upper surface of a central member of a support element of the plurality of support elements and has an upper surface that contacts a lower surface of the third circuit board; and
the first board fixing feature and the second board fixing feature of each support element are aligned with one another and offset to one side of the central member of the support element.

9. The electronic assembly of claim 8, wherein the first circuit board comprises a plurality of openings, and the second board fixing features of each of the support elements extend through a respective one of the plurality of opening in the first circuit board.

10. The electronic assembly of claim 8, wherein the first board fixing feature and the second board fixing feature of each of the support elements are located outside a peripheral edge of the first circuit board.

11. The electronic assembly of claim 10, wherein a width dimension of the central member of each of the support elements increases between a first end of the central member proximate to the first board fixing feature and the second board fixing feature and a second end of the central member that contacts the lower surface of the first circuit board.

* * * * *